United States Patent
Ito

(10) Patent No.: US 10,355,203 B2
(45) Date of Patent: Jul. 16, 2019

(54) SEMICONDUCTOR MEMORY DEVICE WITH VARIABLE RESISTANCE ELEMENTS

(71) Applicant: TOSHIBA MEMORY CORPORATION, Minato-ku, Tokyo (JP)

(72) Inventor: Yuichi Ito, Seongnam-si (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 329 days.

(21) Appl. No.: 15/261,828

(22) Filed: Sep. 9, 2016

(65) Prior Publication Data

US 2017/0263850 A1 Sep. 14, 2017

Related U.S. Application Data

(60) Provisional application No. 62/308,111, filed on Mar. 14, 2016.

(51) Int. Cl.
*H01L 43/12* (2006.01)
*H01L 27/22* (2006.01)
*H01L 43/08* (2006.01)

(52) U.S. Cl.
CPC ............ *H01L 43/12* (2013.01); *H01L 27/228* (2013.01); *H01L 43/08* (2013.01)

(58) Field of Classification Search
CPC ....... H01L 43/02; H01L 27/228; H01L 43/08; H01L 43/10; H01L 43/12
See application file for complete search history.

(56) References Cited

U.S. PATENT DOCUMENTS

| | | | |
|---|---|---|---|
| 2002/0140016 A1* | 10/2002 | Cha | B82Y 10/00 257/302 |
| 2005/0269671 A1* | 12/2005 | Faure | C30B 29/36 257/618 |
| 2006/0145197 A1* | 7/2006 | Baek | H01L 27/14621 257/222 |
| 2010/0097848 A1 | 4/2010 | Ohmori | |
| 2010/0149862 A1 | 6/2010 | Ishiwata et al. | |
| 2011/0201212 A1* | 8/2011 | Yamamoto | C23C 16/401 438/789 |
| 2012/0241884 A1* | 9/2012 | Aikawa | H01L 43/08 257/421 |
| 2014/0070162 A1* | 3/2014 | Iwayama | H01L 43/08 257/4 |
| 2014/0087483 A1* | 3/2014 | Ohsawa | H01J 37/08 438/3 |
| 2015/0249110 A1* | 9/2015 | Do | H01L 27/222 257/421 |
| 2015/0270482 A1* | 9/2015 | Lee | H01L 45/1675 711/146 |

(Continued)

*Primary Examiner* — Charles D Garber
*Assistant Examiner* — S M Sohel Imtiaz
(74) *Attorney, Agent, or Firm* — Holtz, Holtz & Volek PC

(57) ABSTRACT

In general, according to one embodiment, a semiconductor memory device includes: first and second variable resistance elements provided above a semiconductor layer; a first insulation layer provided on top surfaces and side surfaces of the first and the second variable resistance elements; and a first interconnect extending in a first direction and provided on the first insulation layer, at least a portion of the first interconnect being opposed to the side surfaces of the first and second variable resistance elements via the first insulation layer.

4 Claims, 29 Drawing Sheets

(56) References Cited

U.S. PATENT DOCUMENTS

| | | | |
|---|---|---|---|
| 2015/0381907 A1* | 12/2015 | Boettiger | H04N 5/332 348/164 |
| 2016/0043304 A1* | 2/2016 | Chen | H01L 43/08 257/421 |
| 2016/0071905 A1* | 3/2016 | Park | H01L 43/08 711/104 |

* cited by examiner

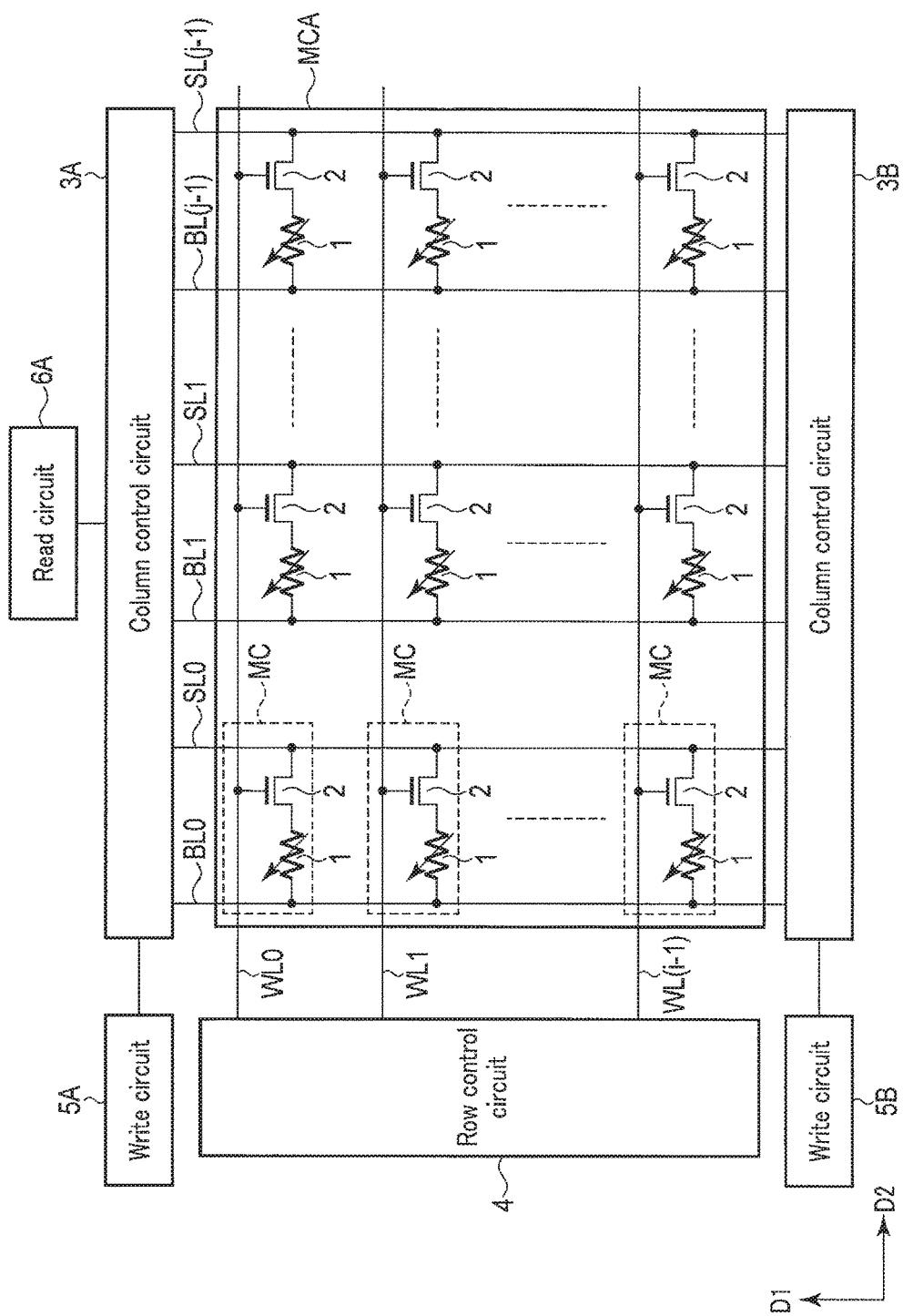
F I G. 1

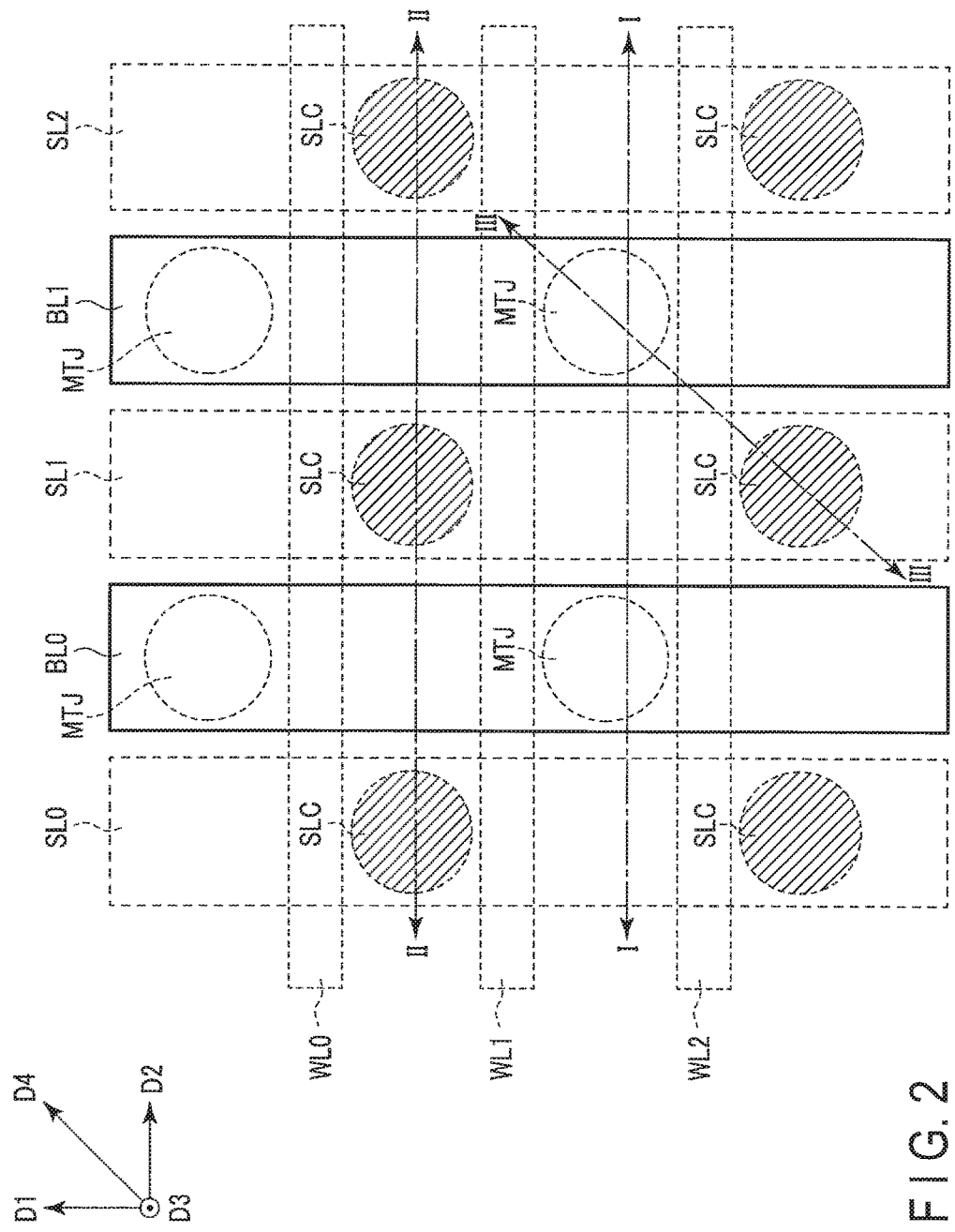
F I G. 2

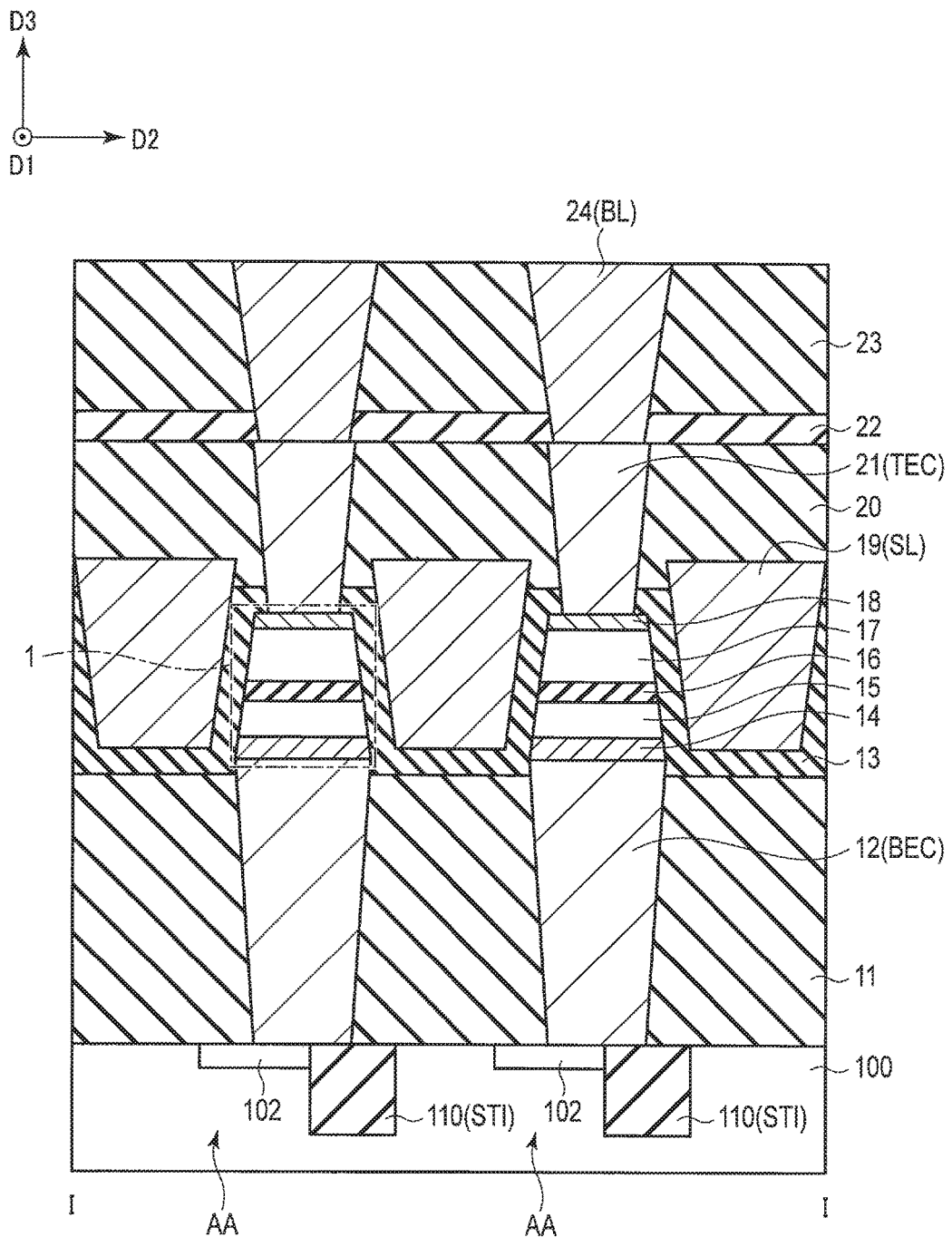
F I G. 3

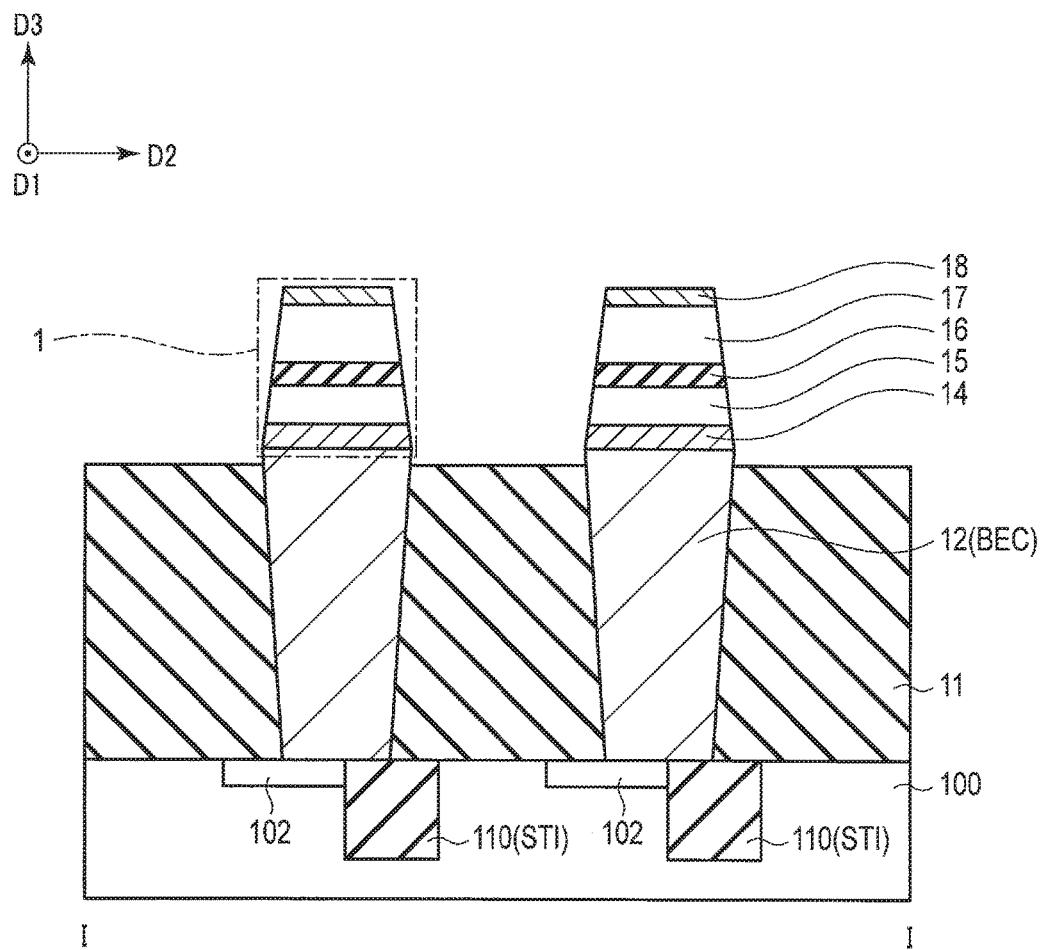
F I G. 6

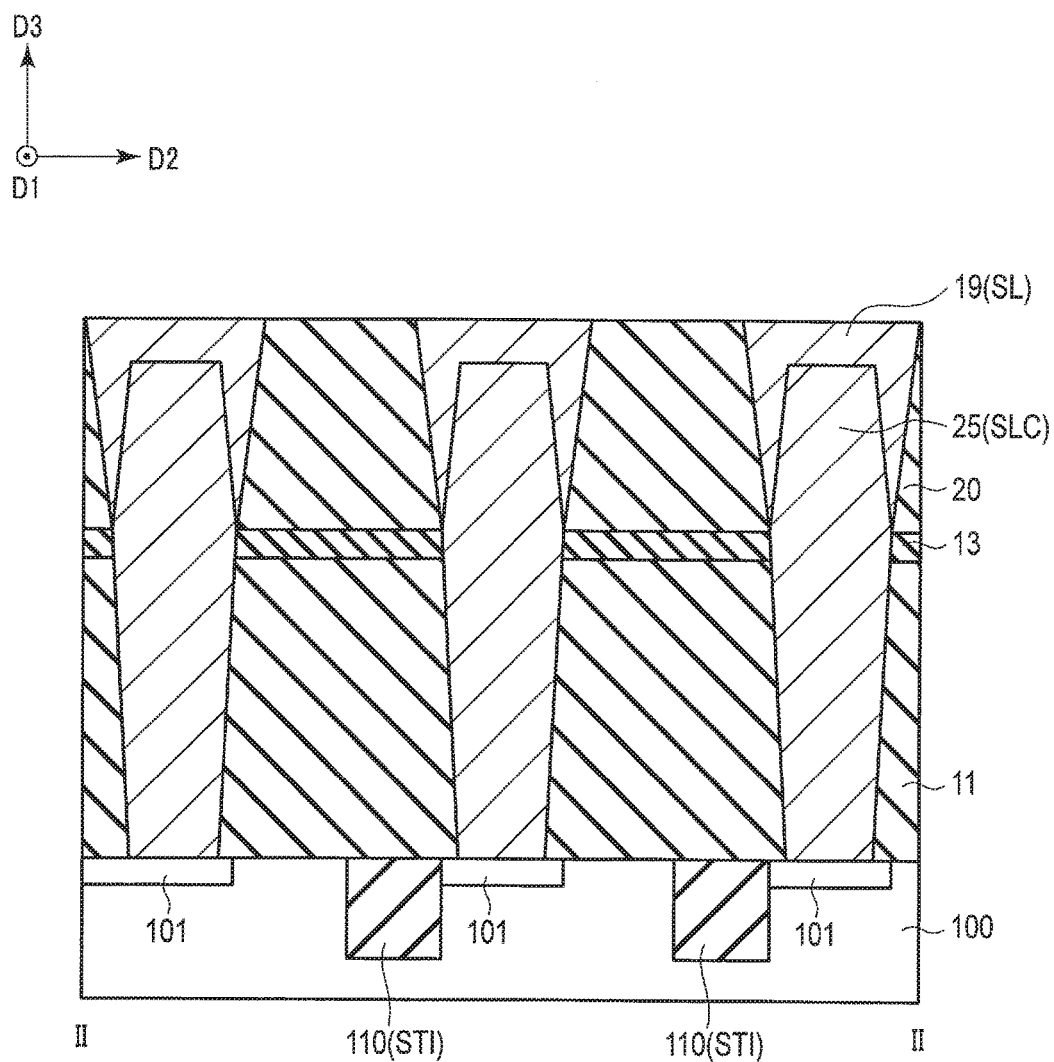
F I G. 15

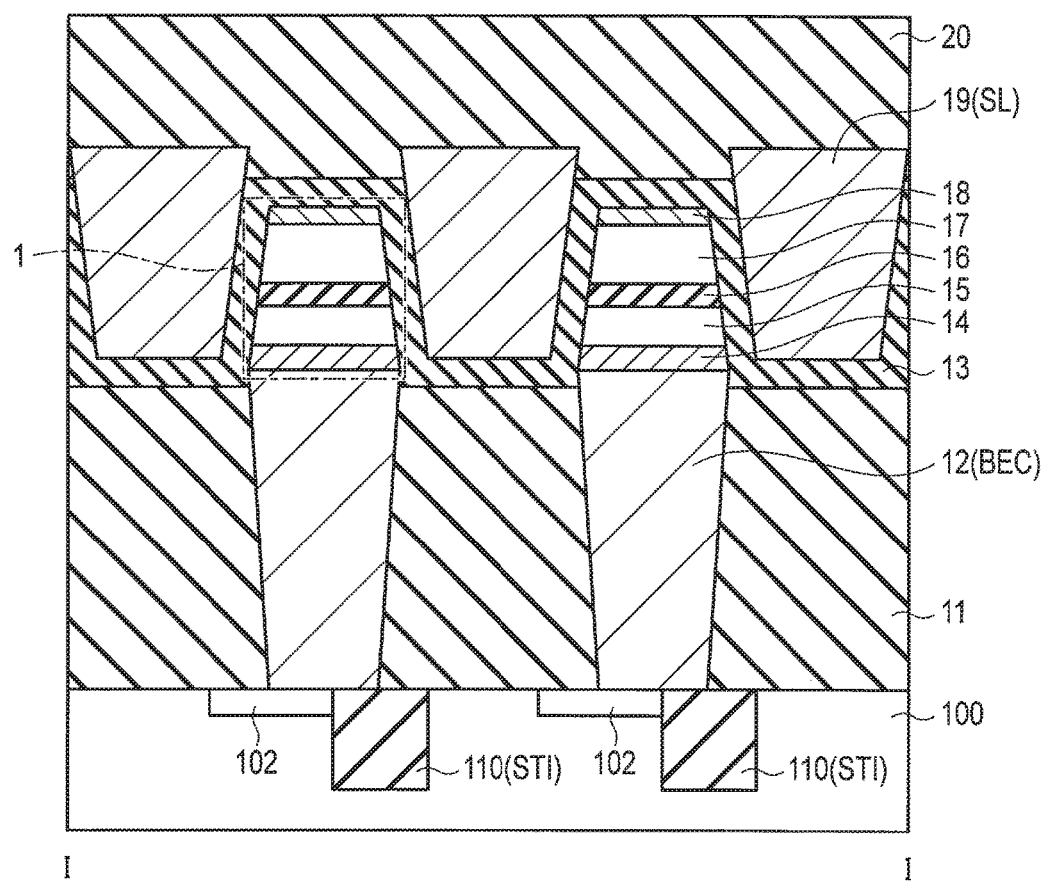
F I G. 16

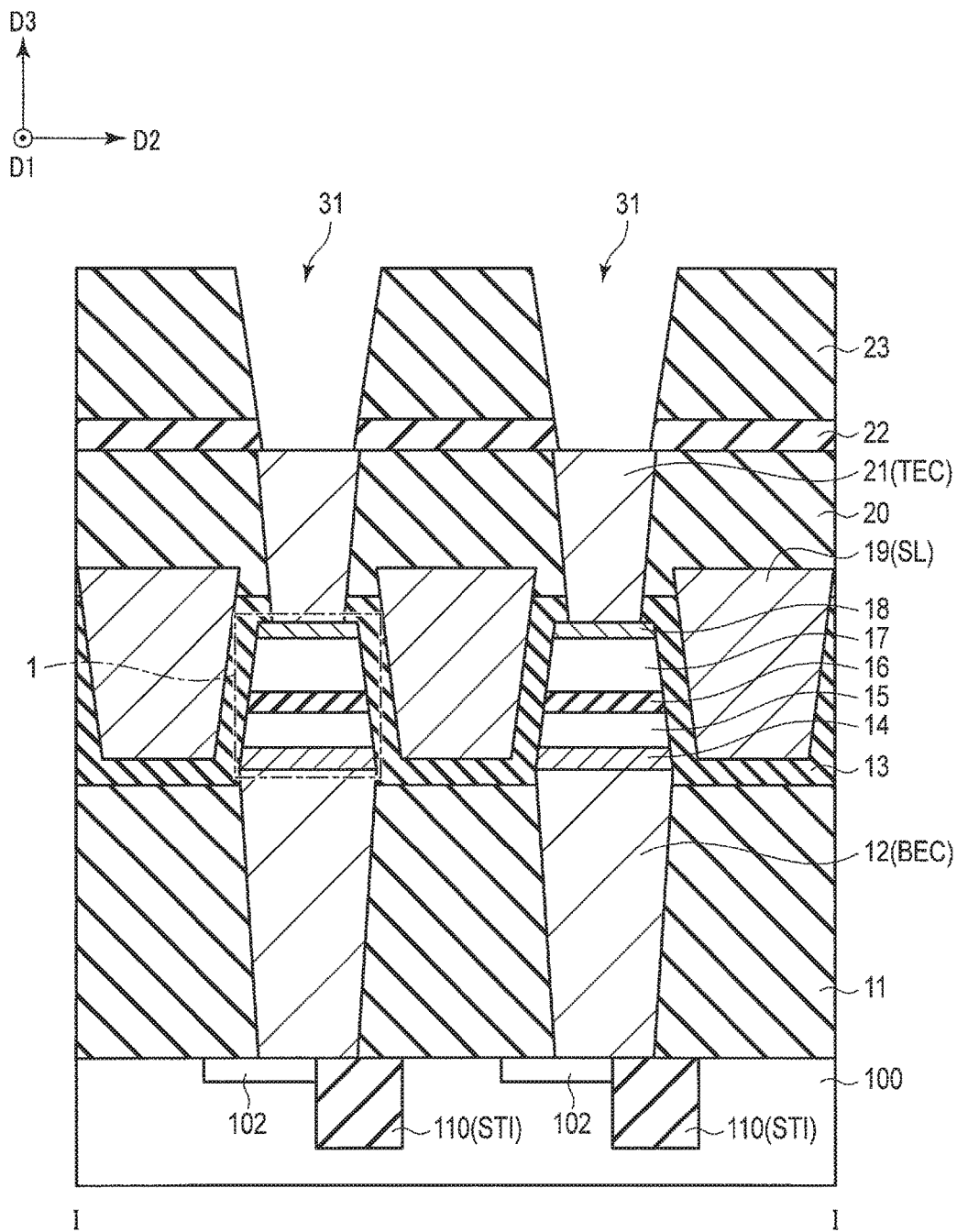
F I G. 20

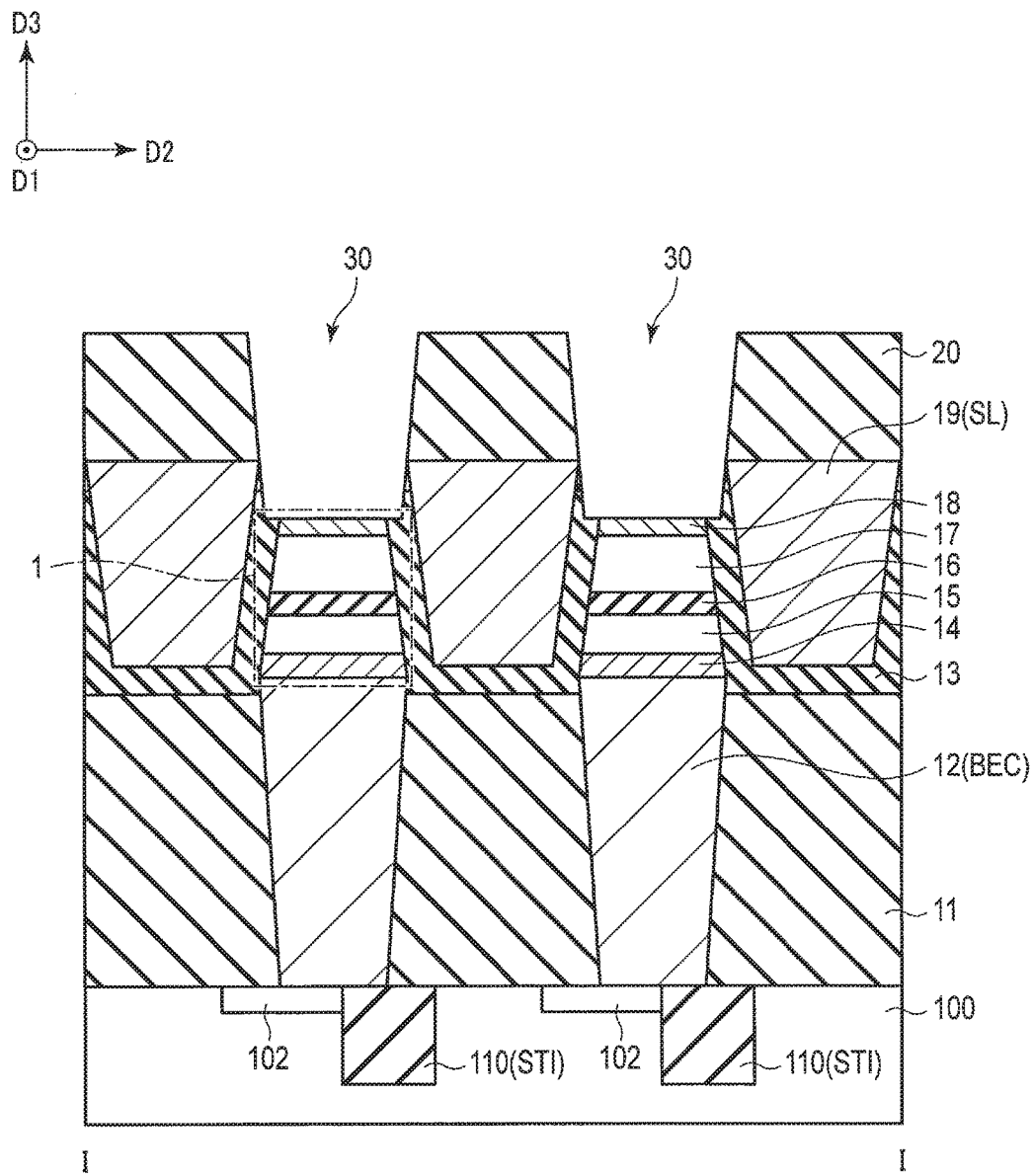
F I G. 22

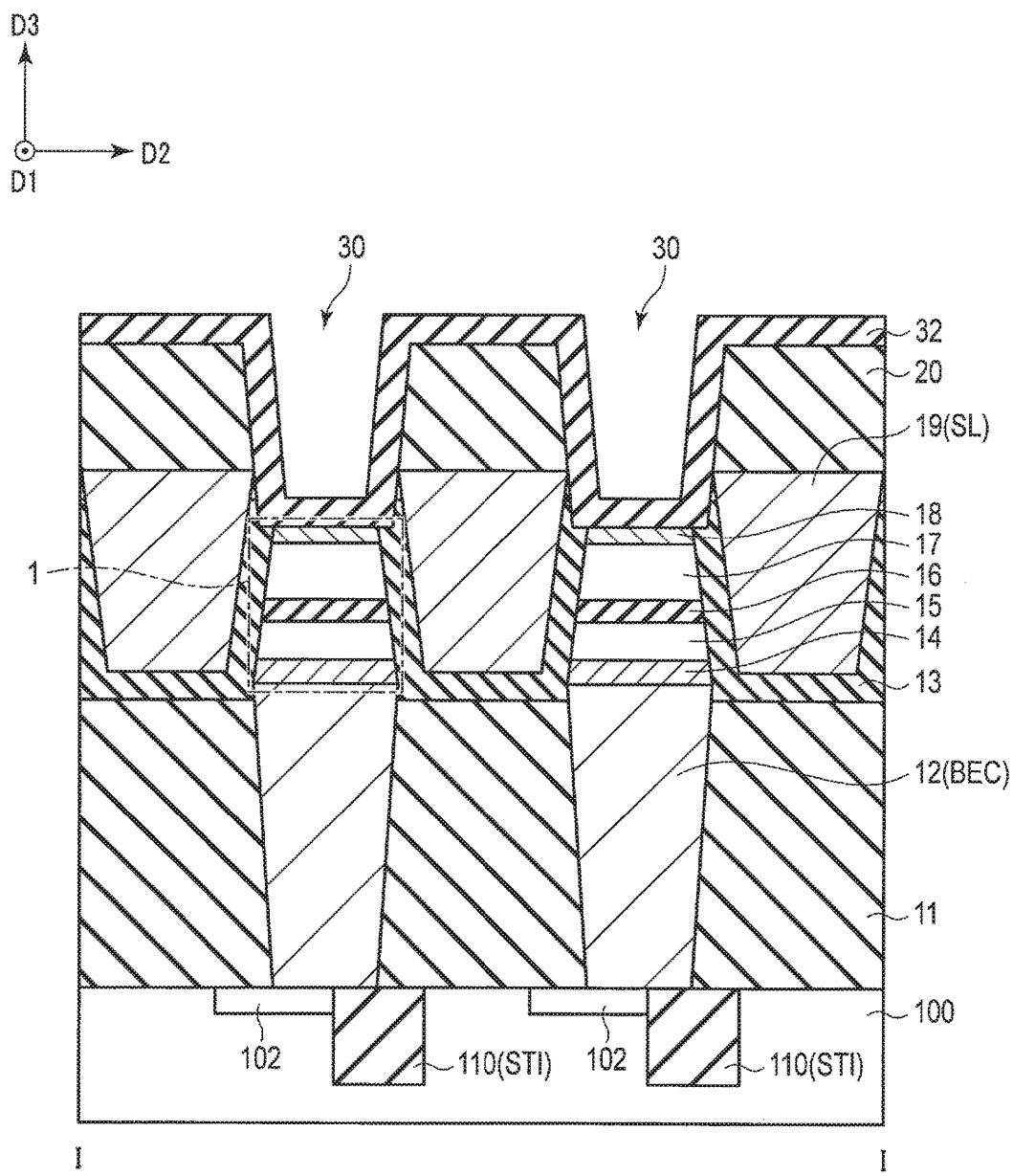
F I G. 23

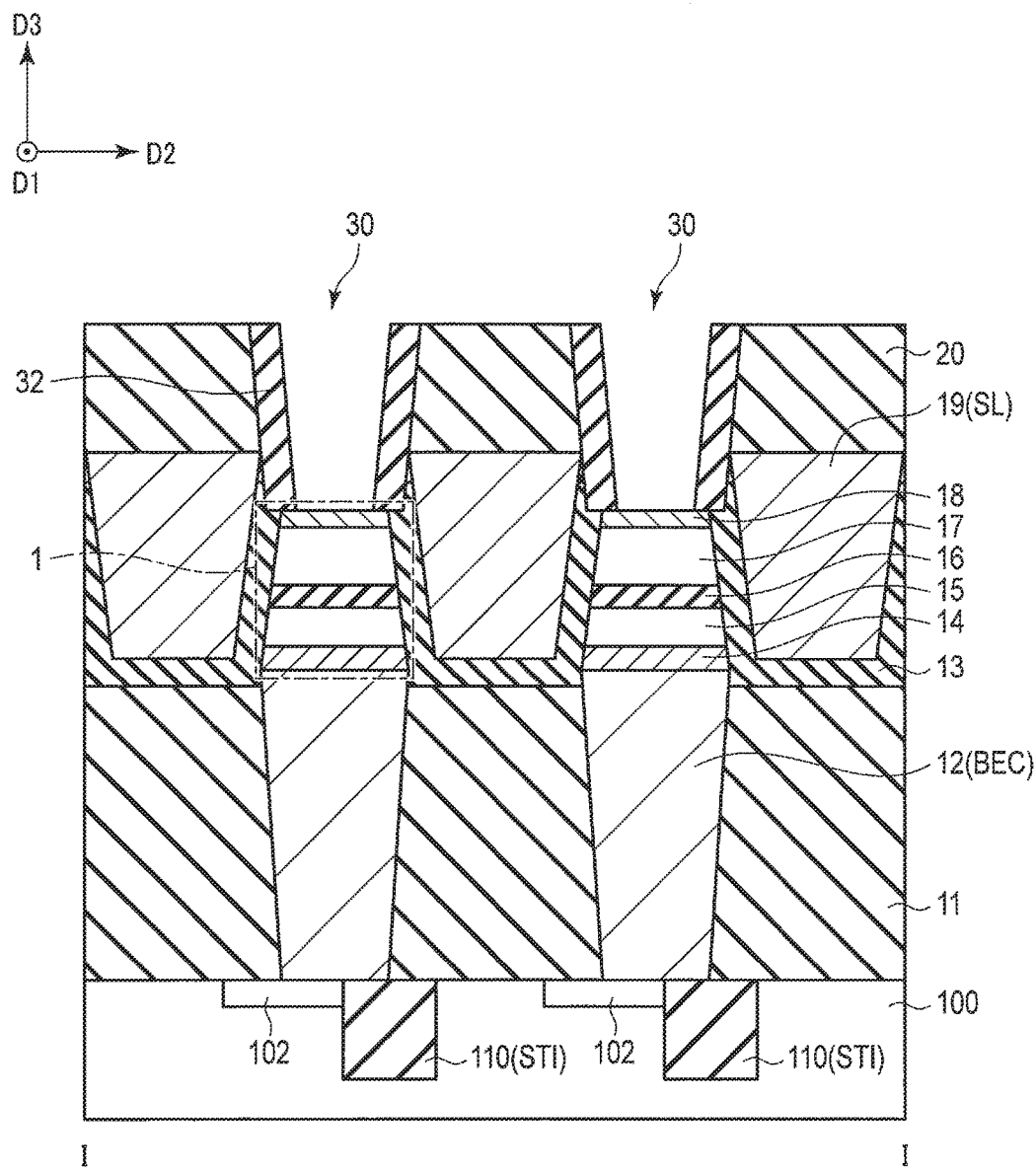
F I G. 24

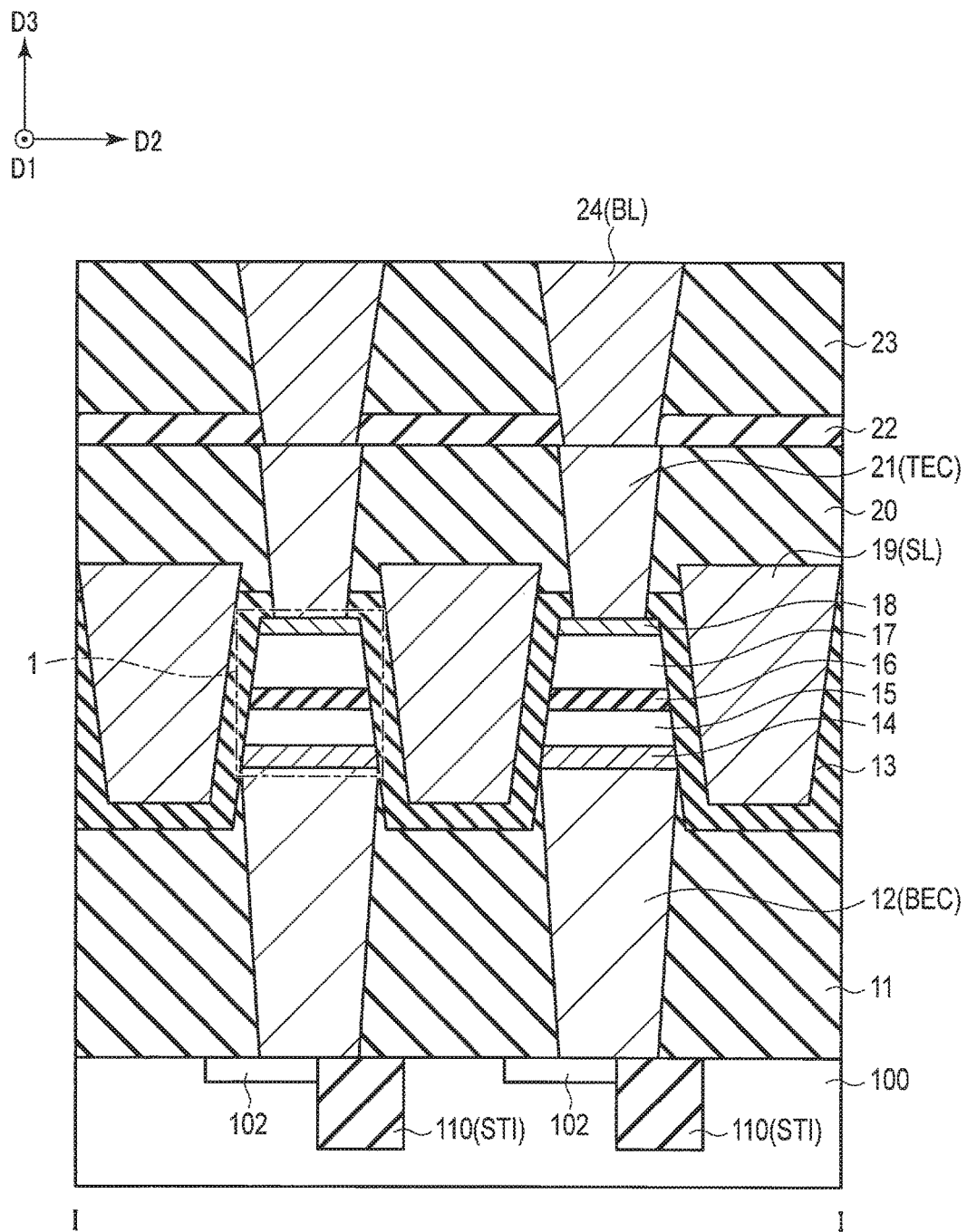
F I G. 27

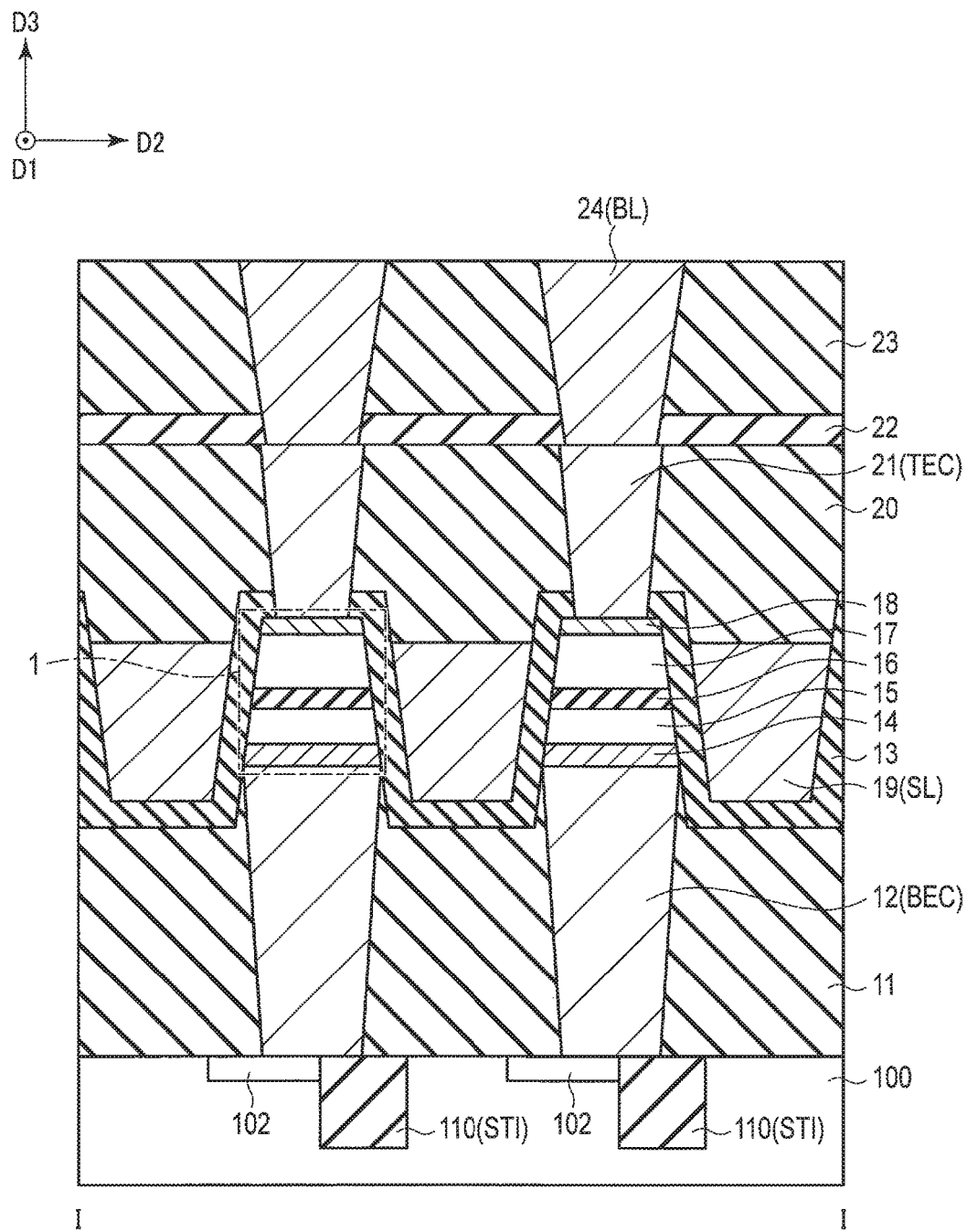
F I G. 28

SEMICONDUCTOR MEMORY DEVICE WITH VARIABLE RESISTANCE ELEMENTS

CROSS-REFERENCE TO RELATED APPLICATIONS

This application claims the benefit of U.S. Provisional Application No. 62/308,111, filed Mar. 14, 2016, the entire contents of which are incorporated herein by reference.

FIELD

Embodiments described herein relate generally to a semiconductor memory device.

BACKGROUND

As a type of semiconductor memory device, a semiconductor memory device including a resistance change type memory is known. As a type of resistance change type memory, a magnetoresistive random access memory (MRAM) is known. The MRAM is a memory device employing a magnetic element having a magnetoresistive effect as a memory cell for storing information, and receives attention as a next-generation memory device characterized by its high-speed operation, large storage capacity, and non-volatility. Research and development have been conducted to use the MRAM as a replacement for a volatile memory, such as a DRAM or SRAM.

BRIEF DESCRIPTION OF THE DRAWINGS

FIG. 1 is a block diagram of a semiconductor memory device according to the first embodiment;

FIG. 2 is a layout chart of a memory cell array in the semiconductor memory device according to the first embodiment;

FIG. 3 is a cross-sectional view of the memory cell array taken along line I-I in FIG. 2;

FIG. 6 is a cross-sectional view of the memory cell array taken along line I-I showing a process of manufacturing the memory cell array in the semiconductor memory device according to the first embodiment;

FIG. 15 is a cross-sectional view of the memory cell array taken along line II-II and showing a process of manufacturing the memory cell array in the semiconductor memory device according to the first embodiment;

FIG. 16 is a cross-sectional view of the memory cell array taken along line I-I and showing a process of manufacturing the memory cell array in the semiconductor memory device according to the first embodiment;

FIG. 20 is a cross-sectional view of the memory cell array taken along line I-I and showing a process of manufacturing the memory cell array in the semiconductor memory device according to the first embodiment;

FIG. 22 is a cross-sectional view of the memory cell array taken along line I-I and showing a process of manufacturing the memory cell array in the semiconductor memory device according to the second embodiment;

FIG. 23 is a cross-sectional view of the memory cell array taken along line I-I and showing a process of manufacturing the memory cell array in the semiconductor memory device according to the second embodiment;

FIG. 24 is a cross-sectional view of the memory cell array taken along line I-I and showing a process of manufacturing the memory cell array in the semiconductor memory device according to the second embodiment;

FIG. 27 is a cross-sectional view of the memory cell array in the semiconductor memory device according to the second modification, taken along line I-I; and FIG. 28 is a cross-sectional view of the memory cell array in the semiconductor memory device according to the third modification, taken along line I-I.

DETAILED DESCRIPTION

Figure 4:
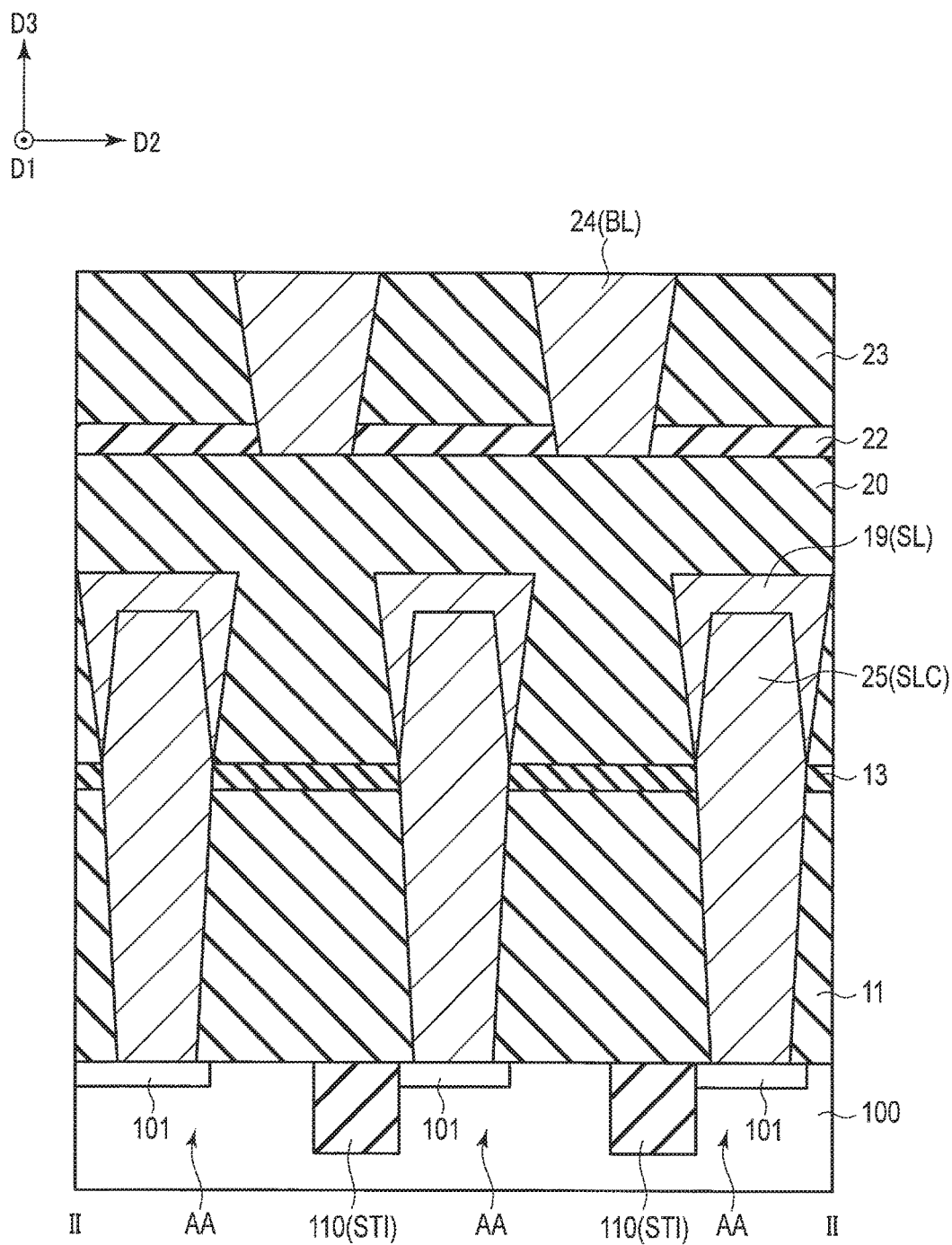
FIG. 4 is a cross-sectional view of the memory cell array taken along line II-II in FIG. 2.

In general, according to one embodiment, a semiconductor memory device includes: first and second variable resistance elements provided above a semiconductor layer; a first insulation layer provided on top surfaces and side surfaces of the first and the second variable resistance elements; and a first interconnect extending in first direction and provided on the first insulation layer, at least a portion of the first interconnect being opposed to the side surfaces of the first and second variable resistance elements via the first insulation layer.

1. First Embodiment

A semiconductor memory device according to the first embodiment is described. The first embodiment will be described by taking an MRAM, which stores data by using a magnetic tunnel junction (MJT) element, as an example of the semiconductor memory device.

1.1 Overall Configuration of Semiconductor Memory Device

First, an overall configuration of the semiconductor memory device according to the present embodiment will be described.

FIG. 1 is a block diagram of the semiconductor memory device according to the first embodiment.

As shown in FIG. 1, the semiconductor memory device according to the first embodiment includes a memory cell array MCA of an MRAM, column control circuits 3A and 3B, a row control circuit 4, write circuits 5A and 5B, and a read circuit 6A.

The memory cell array MCA includes a matrix of plurality of memory cells MC. The memory cell array MCA also includes a plurality of word lines WL0 to WL(i-1) (i is a natural number not less than 1), a plurality of bit lines BL0 to BL(j-1) (j is a natural number not less than 1), and a plurality of source lines SL0 to SL(j-1). Word lines WL0 to WL (i-1) are merely referred to as word line, WL when no distinctions are made therebetween. Bit lines BL0 to BL(j-1) are merely referred to as bit line BL when no distinctions are made therebetween. Source lines SL0 to SL (j-1) are merely referred to as a source line SL when no distinctions are made therebetween.

The extending direction of the bit lines BL and source lines SL is defined as a column direction (first direction D1). The extending direction of the word lines WL, which is nearly orthogonal to the column direction, is defined as a row direction (second direction D2). In FIG. 1, the bit lines BL and source lines SL extend in the column direction, and the word lines WL extend in the row direction; however, the arrangement of the lines is not limited to this, and may be changed as appropriate.

Each memory cell MC is connected to the bit line BL, source line SL, and word line WL. Memory cells MC aligned in the column direction are connected to a common bit line BL, and a common source line SL. Memory cells MC aligned in the row direction are connected to a common word line WL.

Each memory cell MC includes an MTJ element 1 and a selection transistor 2. The selection transistor 2 is an N-channel metal oxide semiconductor field effect transistor (MOSFET), for example.

One end of the MTJ element 1 is connected to a bit line BL, and the other end thereof is connected to the drain (source) of the selection transistor 2. The gate of the selection transistor 2 is connected to a word line WL, and the source (drain) thereof is connected to a source line SL.

One end of the word lines WL are connected to the row control circuit 4. The row control circuit 4 controls selection/un-selection of the word lines WL based on an address signal externally input.

One end and the other end of each of the bit lines BL and the source lines SL are connected to the column control circuits 3A and 3B, respectively. The column control circuits 3A and 3B control selection/an-selection of the bit lines BL and the source lines SL based on an address signal externally input.

The write circuits 5A and 5B are connected respectively to one end and the other end of each of the bit line BL and the source line SL via the column control circuits 3A and 3B. The write circuits 5A and 5B each include a source circuit, such as a current source or voltage source, for generating a write current, and a sink circuit for absorbing the write current.

When data is written, the write circuits 5A and 5B supply a write current to a memory cell MC externally selected (hereinafter referred to as a "selected cell").

When data is written in an MTJ element 1 in a memory cell MC, the write circuits 5A and 5B output a write current to pass through the MTJ element 1 in either direction in accordance with data written in the selected cell. Namely, the write circuits 5A and 5B output a write current that flows from the bit line BL to the source line SL or a write current that flows from the source line SL to the bit line BL in accordance with data written in the MTJ element 1.

The read circuit 6A is connected to one end and the other end of each of the bit line BL and the source line SL via the column control circuits 3A and 3B. The read circuit 6A includes, for example, a voltage source or current source for generating a read current, a sense amplifier that senses and amplifies a read signal, and a latch circuit that temporarily holds data. When data is read from the MTJ element 1, the read circuit 6A supplies a read current to the selected cell. The current value of the read current is smaller than the current value of the write current (magnetization reversal threshold value) so that the read current does not reverse magnetization of a recording layer.

The current value or electrical potential at the read node varies depending on the resistance value of the MTJ element 1 supplied with the read current. Data stored in the MTJ element 1 is distinguished based on the variation of the current value or electrical potential (read signal, read output) corresponding to the resistance value of the MTJ element 1.

In the example shown in FIG. 1, the read circuit 6A is provided on one end side of the column direction; however, two read circuits may be provided respectively on one end and the other end sides of the column direction.

For example, a circuit (hereinafter referred to as "peripheral circuit") other than the column control circuits 3A and 3B, the row control circuit 4, the write circuits 5A and 5B, and the read circuit 6A may be provided in the same chip as the memory cell array MCA. For example, a buffer circuit, a state machine (control circuit), or an error checking and correcting (ECC) circuit may be provided in the chip as the peripheral circuit.

1.2 Layout of Memory Cell Array

Next, a layout of the memory cell array MCA will be described. FIG. 2 is a layout chart of the memory cell array MCA in the semiconductor memory device according to the first embodiment. To simplify the description, FIG. 2 shows three source lines SL0 to SL2, two bit lines BL0 and BL1 and three word lines WL0 to WL2. In FIG. 2, the selection transistor 2, and an element isolation region and interlayer insulation film etc. that will be described later are omitted.

As shown in FIG. 2, the word lines WL extend in the second direction D2, and the bit lines BL and the source lines SL extend in the first direction D1.

The MTJ element 1 ("MTJ" in FIG. 2) is provided to connect a semiconductor substrate and a bit line BL in a third direction D3, which is orthogonal to a plane defined by the first direction D1 and the second direction D2. A source line contact plug (hereinafter referred to as "SLC plug") ("SLC" in FIG. 2) is provided to connect the semiconductor substrate and a source line SL in the third direction D3. A word line WL is located between the MTJ element 1 and the SLC plug in a fourth direction D4, which is on the plane defined by the first direction D1 and the second direction D2, and is different from the first direction D1 and the second direction D2. The terms "contact plug" and "plug" refer to a conductive layer containing a conductive material.

1.3 Cross-Sectional Configuration of Memory Cell Array

Figure 5:
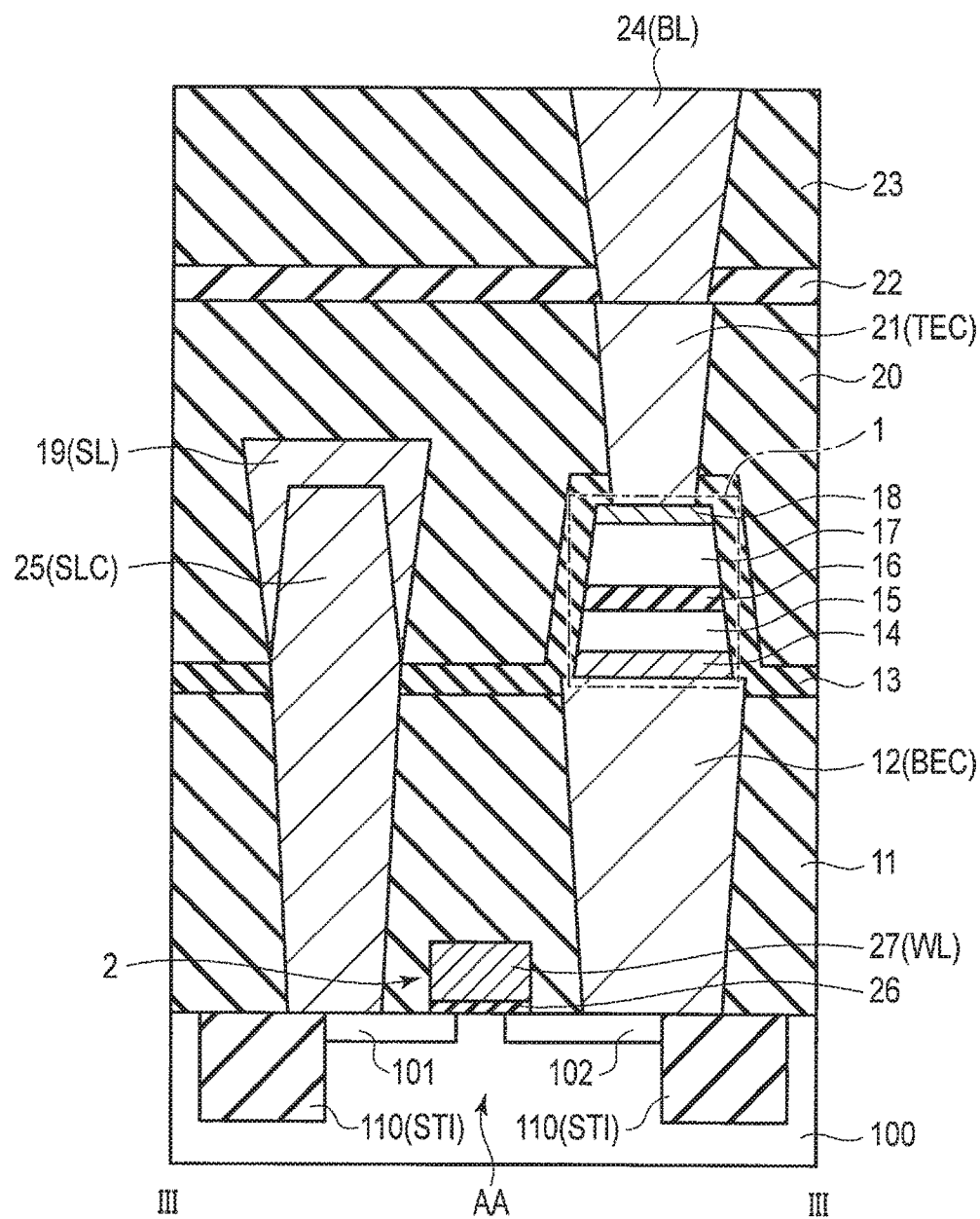
FIG. 5 is a cross-sectional view of the memory cell array taken along line III-III in FIG. 2.

Next, a cross-sectional configuration of the memory cell array MCA will be described. FIGS. 3 to 5 are cross-sectional views of the memory cell array taken along lines I-I, II-II and III-III in FIG. 2, respectively.

As shown in FIG. 3, a plurality of MTJ elements 1 are aligned in the second direction D2. The MTJ element 1 has a bottom surface connected via a bottom electrode contact plug (hereinafter referred to as "BEC plug") 12 ("12(BEC)" in FIG. 3) to a source/drain diffusion layer 102 provided in proximity to a surface of the semiconductor substrate 100, and a top surface connected via a top electrode contact plug (hereinafter referred to as "TEC plug") 21 ("21 (TEC)" in FIG. 3) to interconnect layer 24 ("24(BL)" in FIG. 3) that functions as a bit line BL. Interconnect layers 19 ("19(SL)" in FIG. 3) that function as source lines SL are aligned in the second direction D2 to interpose the MTJ elements 1 therebetween.

More specifically, the semiconductor substrate 100 includes an element isolation region (STI; shallow trench isolation) 110 ("110(STI)" in FIG. 3) to isolate an active area AA. For example, silicon oxide ($SiO_2$) is used for the element isolation region 110. The source/drain diffusion layer 102 of the selection transistor 2 is provided in proximity to a surface of the active area AA.

Insulation layer 11 is provided on the semiconductor substrate 100. For example, $SiO_2$ is used for insulation layer 11. Insulation layer 11 may be a monolayer film or a laminated film. The BEC plug 12 is provided to pass through insulation layer 11 so that the bottom surface thereof reaches the source/drain diffusion layer 102. For example, tungsten (W) is used for the BEC plug 12. The MTJ element 1 is in contact with the top surface of the BEC plug 12.

The MTJ element 1 includes at least a memory layer 15, a tunnel barrier layer 16, and a reference layer 17. The tunnel barrier layer 16 is interposed between the memory layer 15 and the reference layer 17. A bottom electrode 14 is provided at the bottom of the memory layer 15. The bottom electrode 14 electrically connects the MTJ element 1 to the BEC plug 12. A top electrode 18 is provided at the top of the MTJ element 1. The top electrode 18 electrically connects the reference layer 17 to the TEC plug 21.

The memory layer 15 and the reference layer 17 are magnetic layers having perpendicular magnetic anisotropy, for example. The magnetization (magnetization direction) of the memory layer 15 and the reference layer 17 is nearly perpendicular to the layer surface (film surface). The direction of the magnetization of the memory layer 15 is variable, and that of the reference layer 17 is invariable (fixed).

When the direction of the magnetization of the memory layer 15 is the same as that of the reference layer 17 (when the MTJ element 1 is in a magnetization parallel alignment state), the MTJ element 1 has a first resistance state (first resistance value) When the direction of the magnetization of the memory layer 15 is different from that of the reference layer 17 (when the MTJ element 1 is in a magnetization antiparallel alignment state), the MTJ element 1 has a second resistance state (second resistance value). The resistance value of the MTJ element 1 in the first resistance state is smaller than that in the second resistance state.

For the memory layer 15, cobalt iron boron (CoFeB) or iron boride (FeB) may be used, for example. For the reference layer 17, cobalt platinum (CoPt), cobalt nickel (CoNi) or cobalt palladium (CoPd) may be used, for example.

The tunnel barrier layer 16 is made of a non-magnetic material, such as a non-magnetic metal, non-magnetic semiconductor or insulator. For the tunnel barrier layer 16, magnesium oxide (MgO) or aluminum oxide ($Al_2O_3$) may be used, for example.

For the bottom electrode 14, for example, a material having low electric resistance and excellent diffusion resistance is desirable. For the bottom electrode 14, for example, Ta/Cu/Ta, which is a laminated film of tantalum (Ta) and copper (Cu), may be used.

The top electrode 18 serves as not only an electrode, but also as a mask for patterning the MTJ element 1. Consequently, for the top electrode 18, a material having low electric resistance and excellent diffusion resistance and also having excellent etching resistance or milling resistance is desirable. For the top electrode 18, a monolayer film of W, Ta, tantalum nitride (TaN), titanium (Ti), titanium nitride (TiN), platinum (Pt), or ruthenium (Ru) etc., or a laminated film including a film of this element or compound may be used, for example.

The MTJ element 1 is provided just above the BEC plug 12, but may be shifted from just above the BBC plug 12 (e.g., above the gate electrode of the selection transistor 2) by using an intermediate interconnect layer.

Insulation layer 13 is formed to cover the top surface and side surfaces of the MTJ element 1. Insulation layer 13 is given a role to radiate heat (Joule heat) generated by the MTJ element 1, and thus is preferably made of an insulation material having higher thermal conductivity than insulation layer 20 (e.g., $SiO_2$) Insulation layer 13 is also preferably made of an insulation material having a lower oxygen and water permeability than insulation layer 20 (e.g., $SiO_2$) to suppress oxidization of the MTJ element 1. For insulation layer 13, silicon nitride (SiN), aluminum nitride (AlN), aluminum oxide ($Al_2O_3$), silicon carbide (SiC), silicon oxynitride (SiON), or silicon carbonitride (SiCN) may be used, for example.

SiN has higher thermal conductivity and lower water permeability than $SiO_2$, and thus can suppress oxidization of the MTJ element 1. SiN is used in the semiconductor manufacturing field for general purposes, and may be formed by chemical vapor deposition (CVD).

AlN has higher thermal conductivity than $SiO_2$, SiN, and $Al_2O_3$, and is used for, for example, a heat sink. AlN may be formed by reactive sputtering.

$Al_2O_3$ has higher thermal conductivity than $SiO_2$ and SiN, and has high insulation properties and mechanical strength. $Al_2O_3$ may be formed by reactive sputtering.

SiC has higher thermal conductivity than $SiO_2$, SiN, and $Al_2O_3$.

SiON has higher thermal conductivity than $SiO_2$, and lower dielectric constant than SiN. SiON also has lower oxygen and moisture permeability than $SiO_2$. SiON is used in the semiconductor manufacturing field for general purposes, and may be formed by CVD.

SiCN has lower dielectric constant than SiN. SiCN is widely used as a Cu diffusion barrier insulation film in the semiconductor manufacturing field, and may be formed by CVD.

Insulation layer 13 may be a monolayer film or a laminated film made of a plurality of monolayer films, for example. The level of the bottom surface of insulation layer 13 relative to the third direction D3 is lower than that of the top surface of the BEC plug 12 in FIG. 3, but may be the same as that of the top surface of the BEC plug 12. The level of the bottom surface of insulation layer 13 depends on the processing condition of the MTJ element 1.

Interconnect layers 19 extend in the first direction D1 to interpose the MTJ elements 1 therebetween in the second direction D2 in such a manner that the bottom surface and part of the side surfaces are brought into contact with insulation layer 13. Interconnect layer 19 functions as a source line SL, and is made of Cu, Al, or W, for example. Interconnect layer 19 is given a role to radiate heat (Joule heat) generated by the MTJ element 1, and thus is preferably made of a conducting material having high thermal conductivity.

The level of the bottom surface of interconnect layer 19 is higher than the level of the bottom surface of the bottom electrode 14 of the MTJ element 1, and lower than the level of the top surface of the top electrode 18 of the MTJ element 1 in FIG. 3, but may be lower than the level of the bottom surface of the bottom electrode 14. The level of the bottom surface of interconnect layer 19 depends on the level of the bottom surface of insulation layer 13 on insulation layer 11, and the film thickness of insulation layer 13. The level of the top surface of interconnect layer 19 is higher than the level of the top surface of the upper electrode 18 of the MTJ element 1, but may be any level higher than the level of the bottom surface of the bottom electrode 14. For example, the level of the top surface of interconnect layer 19 may be lower than the level of the top surface of the top electrode 18 of the MTJ element 1e in The relationship between the height of interconnect layer 19 and that of the MTJ element 1 is not particularly limited. The height of interconnect layer 19 may be equal to, greater than, or smaller than that of the MTJ element 1.

Insulation layer 20 is provided on interconnect layer 19 and insulation layer 13. For example, SiO₂ is used for insulation layer 20. The TEC plug 21 is provided to pass through insulation layer 20 so that the bottom surface thereof reaches the top electrode 18. For the TEC plug 21, Cu, Al, or W is used, for example.

Insulation layers 22 and 23 are provided on insulation layer 20. For insulation layer 22, SiN, SiCN, or SiON is used, for example. For example, insulation layer 22 is preferably an insulation film not including oxygen (O) to suppress surface oxidization of the TEC plug 21. For insulation layer 23, SiO₂ is used, for example. Interconnect layer 24 extending in the first direction is provided to pass through insulation layers 22 and 23 so that the bottom surface thereof reaches the TEC plug 21. Interconnect layer 24 functions as a bit line SL, and is made of Cu, Al, or W, for example. In the present embodiment, interconnect layer 19, which functions as a source line SL, and interconnect layer 24, which functions as a bit line BL, are provided in different layers. Namely, the level of the bottom surface of interconnect layer 19 differs from that of interconnect layer 24. The relationship between the height of interconnect layer 19 and that of interconnect layer 24 is not particularly limited. The height of interconnect layer 19 may be equal to, greater than, or smaller than that of interconnect layer 24. In addition, the relationship between the width of interconnect layer 19 and that of interconnect layer 24 is not particularly limited. The width of interconnect layer 19 may be equal to, greater than, or smaller than that of interconnect layer 24.

The MTJ element 1 may be a laminated layer of the bottom electrode 14, the reference layer 17, the tunnel barrier layer 16, the memory layer 15, and the top electrode 18 stacked from the bottom in the order of appearance. Namely, in the MTJ element 1, the positions of the memory layer 15 and the reference layer 17 may be interchanged.

The MTJ element 1 shown in FIG. 3 has a trapezoidal laminated structure of the bottom electrode 14, the memory layer 15, the tunnel barrier layer 16, the reference layer 17, and the top electrode 18, but the shape is not particularly limited to this. The shape may be a rectangular parallelepiped, a trapezoid having a bottom base shorter than the upper base, or a shape with steps of layers, depending on the etching characteristics of the MTJ element 1. Similarly to the shape of the MTJ element 1, the shapes of the BEC plug 12, the TEC plug 21, interconnect layer (SL) 19, and interconnect layer (BL) 24 are a trapezoid having a bottom base shorter than the upper base, but are not particularly limited.

Next, the cross-section taken along line II-II will be described.

As shown in FIG. 4, source/drain diffusion layer 101 of the selection transistor 2 is provided in proximity to the surface of the active area AA. The SLC plug 25 ("25(SLC)" in FIG. 4) is provided to connect interconnect layer 19 to source/drain diffusion layer 101. For the SLC plug 25, Cu, Al, or W is used, for example.

Next, the cross-section taken along line III-III will be described.

Each active area AA includes source/drain diffusion. layers 101 and 102 of the selection transistor 2. On the active area AA, gate insulation film 26 of the selection transistor 2 and gate electrode 27 ("27.(WL)" in FIG. 5) that functions as a word line WL are provided. Source/drain diffusion layer 101 of one selection transistor 2 is connected to interconnect layer 19 via the SLC plug 25, and source/drain diffusion layer 102 is connected to the MTJ element 1 via the BEC plug 12.

1.4 Method for Forming Memory Cell Array

Next, a method for forming a memory cell array MCA will be described while focusing on formation of interconnect layer 19 and the TEC plug 21. For simplification of the description, a description of photolithography is omitted.

FIGS. 6-20 are cross-sectional views of the memory cell array MCA in the semiconductor memory device according to the first embodiment showing a process of manufacturing the memory cell array MCA. FIGS. 6-9, 12, 14, and 16-20 show cross-sectional views taken along line I-I in FIG. 2, and FIGS. 10, 11, and 15 show cross-sectional views taken along line II-II in FIG. 2.

First, the element isolation region 110 and the active area AA are formed in the semiconductor substrate 100. The selection transistor 2 including source/drain diffusion layers 101 and 102 is formed in the active area AA. Then, insulation layer 11 is formed on the semiconductor substrate 100, as shown in FIG. 6. Subsequently, the BEC plug 12 which teaches source/drain diffusion layer 102 is formed in insulation layer 11, and the MTJ element 1 is formed to come into contact with the top surface of the BEC plug 12.

Figure 7:
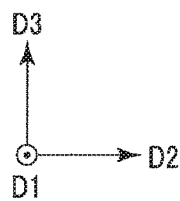
FIG. 7 is a cross-sectional view of the memory cell array taken along line I-I and showing a process of manufacturing the memory cell array in the semiconductor memory device according to the first embodiment.
Figure 7:
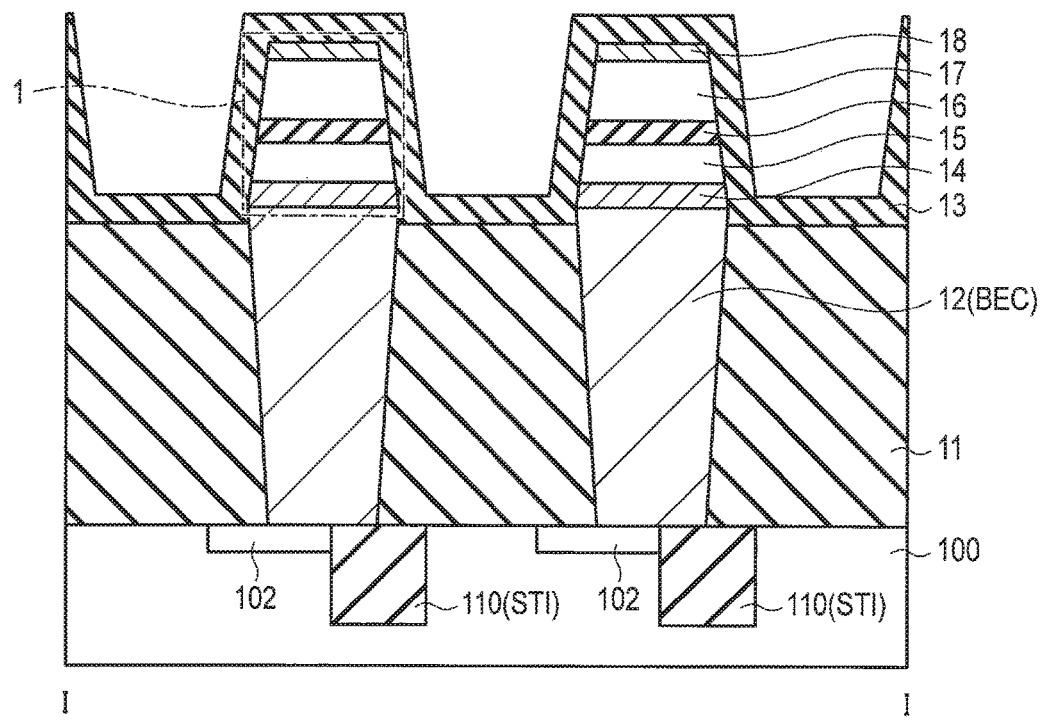

As shown in FIG. 7, insulation layer 13 is formed to cover the upper and side surfaces of the MTJ element 1 and the top surface of insulation layer 11. The film thickness of insulation layer 13 is preferably thin to lower the resistance of interconnect layer 19 to be formed later (so as to increase the width of interconnect layer 19), but is a film thickness which does not cause a short circuit between the MTJ element 1 and interconnect layer 19. Namely, the film thickness is larger than a short circuit margin between the MTJ element 1 and interconnect layer 19.

Figure 8:
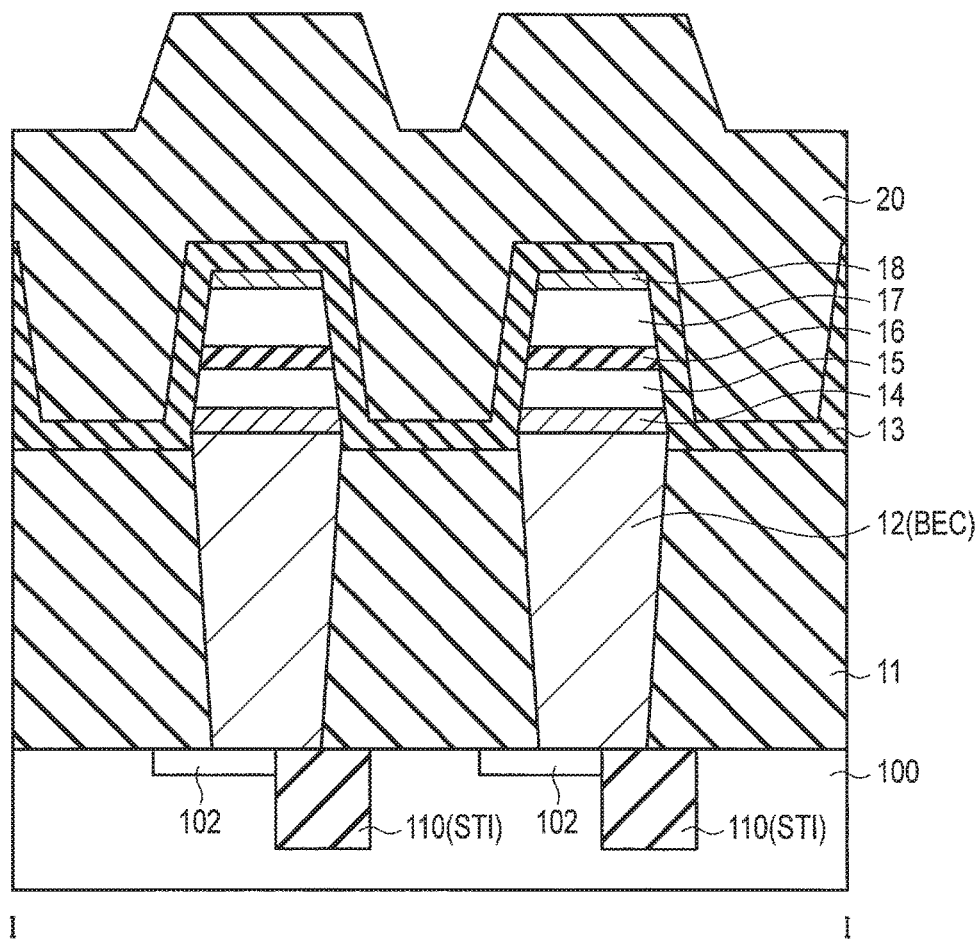
FIG. 8 is a cross-sectional view of the memory cell array taken along line I-I and showing a process of manufacturing the memory cell array in the semiconductor memory device according to the first embodiment.

As shown in FIG. 8, insulation layer 20 is formed on insulation layer 13. $SiO_2$ is deposited by plasma CVD using tetraethyl orthosilicate (TEOS) and $O_2$, for example. The surface of insulation layer 20 partly protrudes due to the shape of the MTJ element 1 thereunder.

Figure 9:
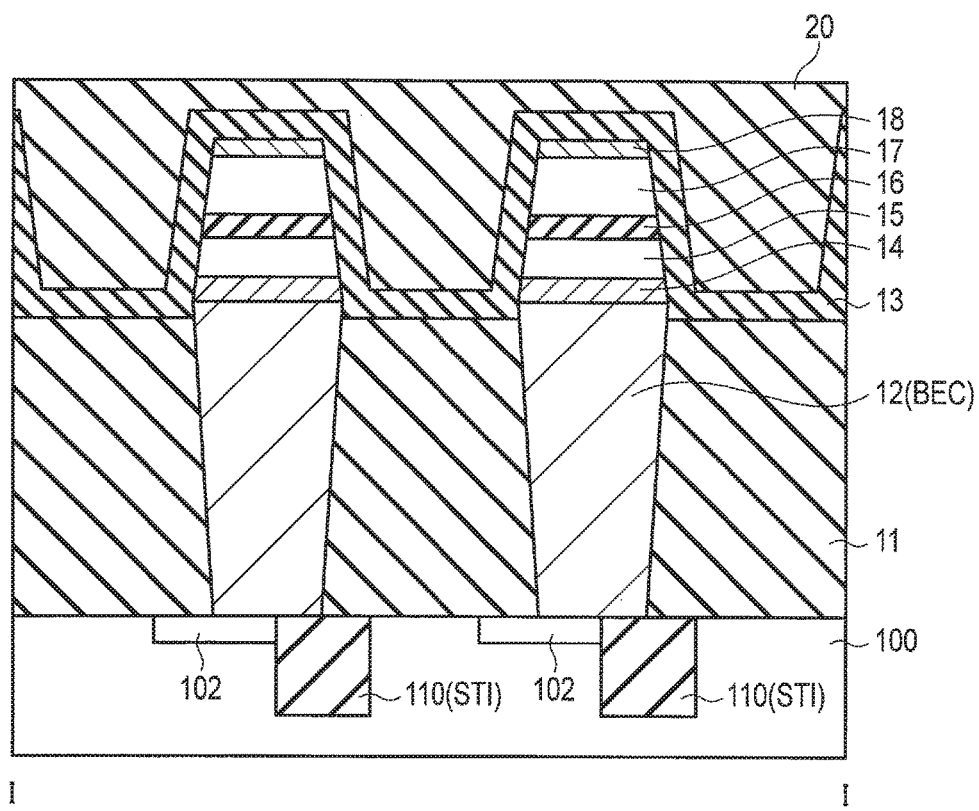
FIG. 9 is a cross-sectional view of the memory cell array taken along line I-I and showing a process of manufacturing the memory cell array in the semiconductor memory device according to the first embodiment.

As shown in FIG. 9, the surface of insulation layer 20 is planarized by chemical mechanical polishing (CMP), for example.

Figure 10:
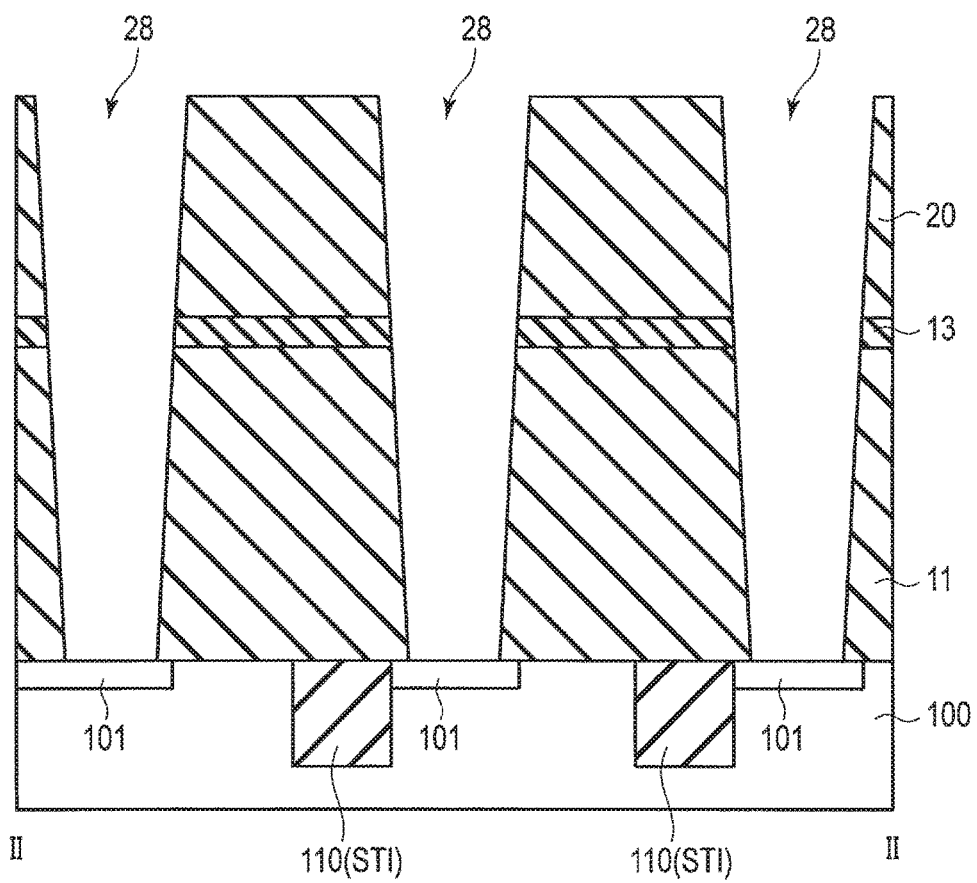
FIG. 10 is a cross-sectional view of the memory cell array taken along line II-II and showing a process of manufacturing the memory cell array in the semiconductor memory device according to the first embodiment.

As shown in FIG. 10, for formation of the SLC plug 25, insulation layers 20, 13, and 11 are partly etched to form a hole 28 which reaches source/drain diffusion layer 101.

Figure 11:
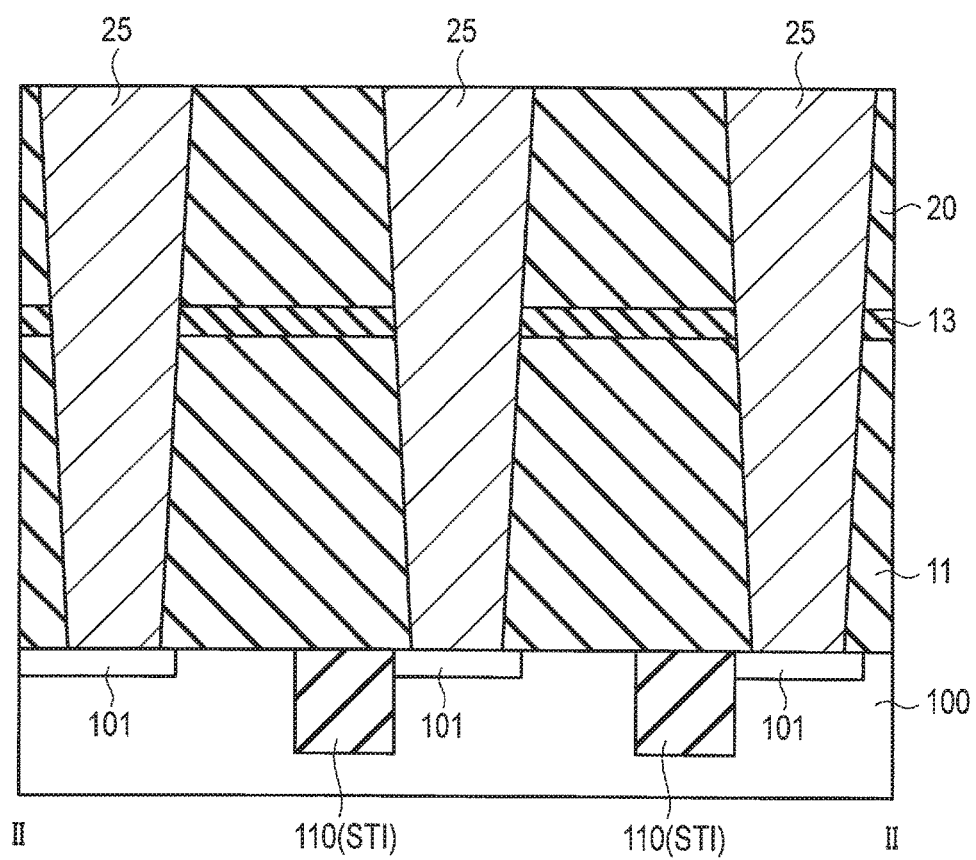
FIG. 11 is a cross-sectional view of the memory cell array taken along line II-II and showing a process of manufacturing the memory cell array in the semiconductor memory device according to the first embodiment.

As shown in FIG. 11, the hole 28 is filled with a conductive material to form the SLC plug 25. As an example, a case where the hole 28 is filled with W will be described. As an underlying film, a TiN/Ti thin film is formed by spattering or CVD, for example. For example, Ti reacts with the semiconductor substrate 100 to form a Ti silicide layer, and reduces the contact resistance between the SLC plug 25 and the semiconductor substrate 100. For example, TiN functions as a barrier metal which improves adhesiveness of W and suppresses a reaction between the semiconductor substrate 100 and tungsten hexafluoride ($WF_6$), which is a deposition gas for depositing W. Next, W is deposited by CVD to fill the hole 28. A laminated film of W/TiN/Ti on insulation layer 20 is removing by CMP to form the SLC plug 25.

Figure 12:
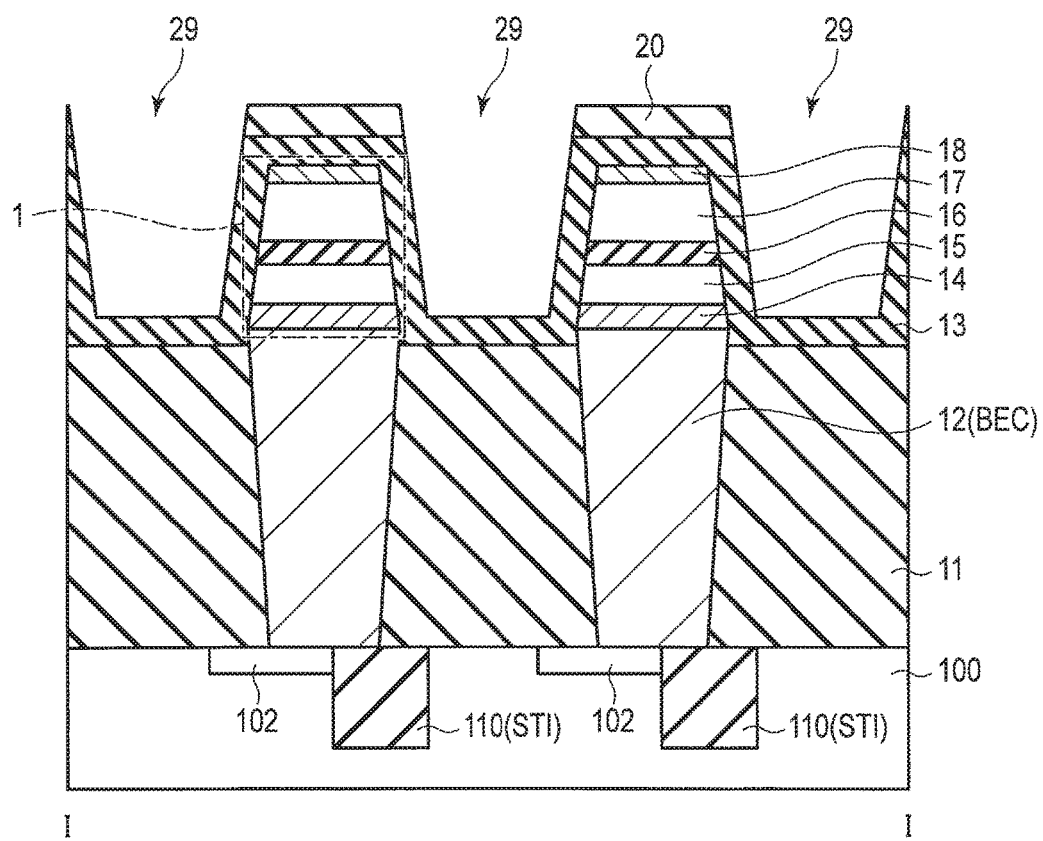
FIG. 12 is a cross-sectional view of the memory cell array taken along line I-I and showing a process of manufacturing the memory cell array in the semiconductor memory device according to the first embodiment.
Figure 13:
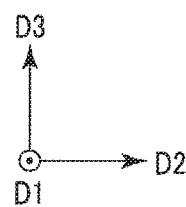
FIG. 13 is a cross-sectional view of the memory cell array taken along line II-II and showing a process of manufacturing the memory cell array in the semiconductor memory device according to the first embodiment.
Figure 13:
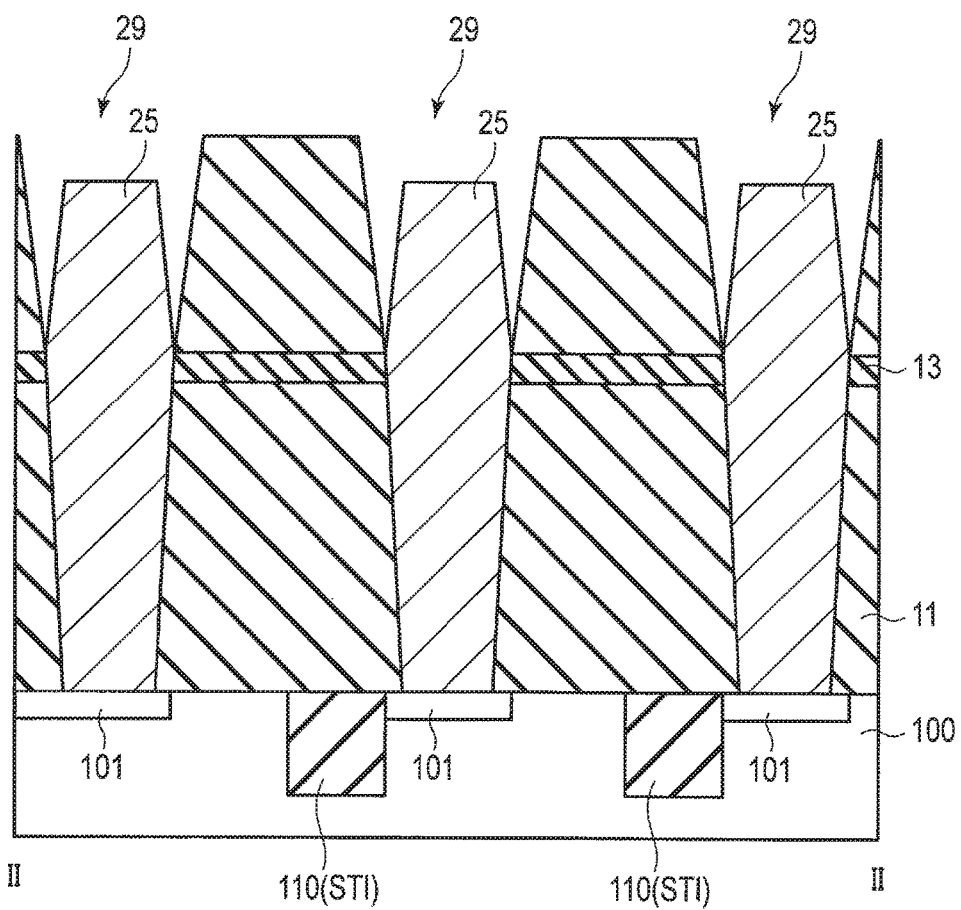

As shown in FIGS. 12 and 13, insulation layer 20 is partly etched to form a slit 29 which extends in the first direction D1 in such a manner that the bottom surface of the slit 29 reaches insulation layer 13. Concretely, when insulation layer 20 is etched, a condition which makes the etching selectivity of insulation layer 20 different from that of insulation layer 13 is applied. Namely, insulation layer 20 is etched under a condition which allows insulation layer 20 to be etched, but insulation layer 13 to be scarcely etched, or a condition in which the etching rate of insulation layer 13 is sufficiently small relative to that of insulation layer 20.

Accordingly, insulation layer 13 functions as an etching stopper layer. Etching to form the slit 29 almost stops when the bottom surface reaches insulation layer 13. Namely, the depth of the slit 29 is determined based on the level of insulation layer 13. The MTJ element is not etched because its upper and side surfaces are covered with insulation layer 13. In FIG. 12, the depth and the width of the slit 29 between MTJ elements are determined in a self-aligned manner in accordance with the level of the bottom surface of insulation layer 13 and the distance between the side surfaces of insulation layer 13.

As shown in FIG. 13, when the slit 29 is etched, the exposed SLC plug 25 is partly etched. The etching amount of the SLC plug 25 depends on the etching condition and thus, the shape of the exposed SLC plug 25 is not particularly limited.

Figure 14:
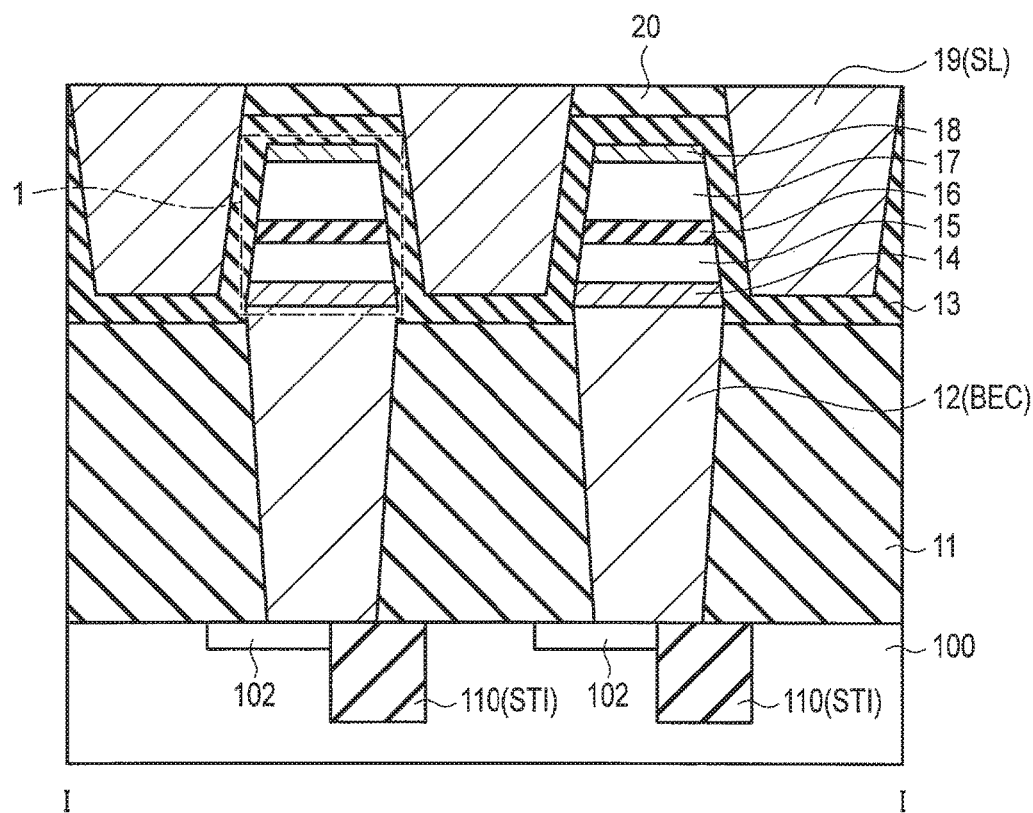
FIG. 14 is a cross-sectional view of the memory cell array taken along line I-I and showing a process of manufacturing the memory cell array in the semiconductor memory device according to the first embodiment.

As shown in FIGS. 14 and 15, the slit 29 is filled with a conductive material to form interconnect layer 19. As an example, a case where the slit 29 is filled with Cu will be described. As an underlying film, a Cu/Ta/TaN thin film is first formed by spattering, for example. For example, TaN improves adhesiveness between Ta and insulation layer 13 or insulation layer 20, and suppresses oxidization of Ta. Ta improves adhesiveness with Cu and prevents diffusion of Cu. A thin film Cu formed by sputtering functions as an electrode layer for forming Cu by electric field plating. Next, Cu is formed by electric field plating to fill the slit 29. Thereafter, Cu/Ta/TaN on insulation layer 20 are removed by CMP to form interconnect layer 19.

As shown in FIG. 16, insulation layer 20 is further formed to cover interconnect layer 19 and insulation layer 13 between interconnect layers 19. Insulation layer 20 may be a monolayer film or a laminated film. For example, when interconnect layer 19 is made of Cu, SiN, for example, may be formed to cover the surface of interconnect layer 19, and $SiO_2$ may be formed thereon to suppress oxidization of Cu. In this case, the insulation layer 20 is a laminated film of SiN and $SiO_2$.

Figure 17:
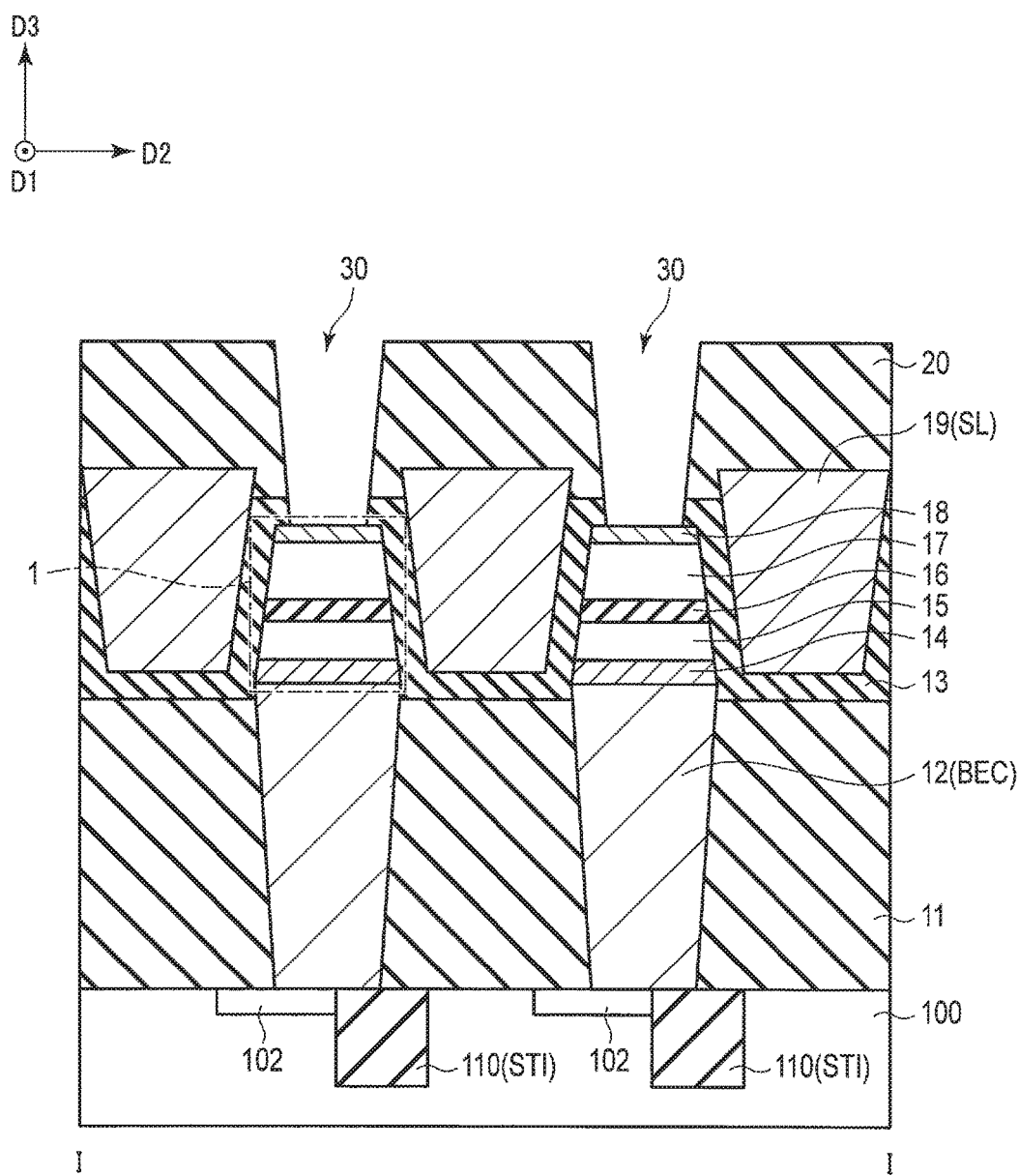
FIG. 17 is a cross-sectional view of the memory cell array taken along line I-I and showing a process of manufacturing the memory cell array in the semiconductor memory device according to the first embodiment.

As shown in FIG. 17, insulation layer 20 is partly etched to form a hole 30 in such a manner that the bottom surface of the hole 30 reaches the top electrode 18 of the MTJ element 1.

Figure 18:
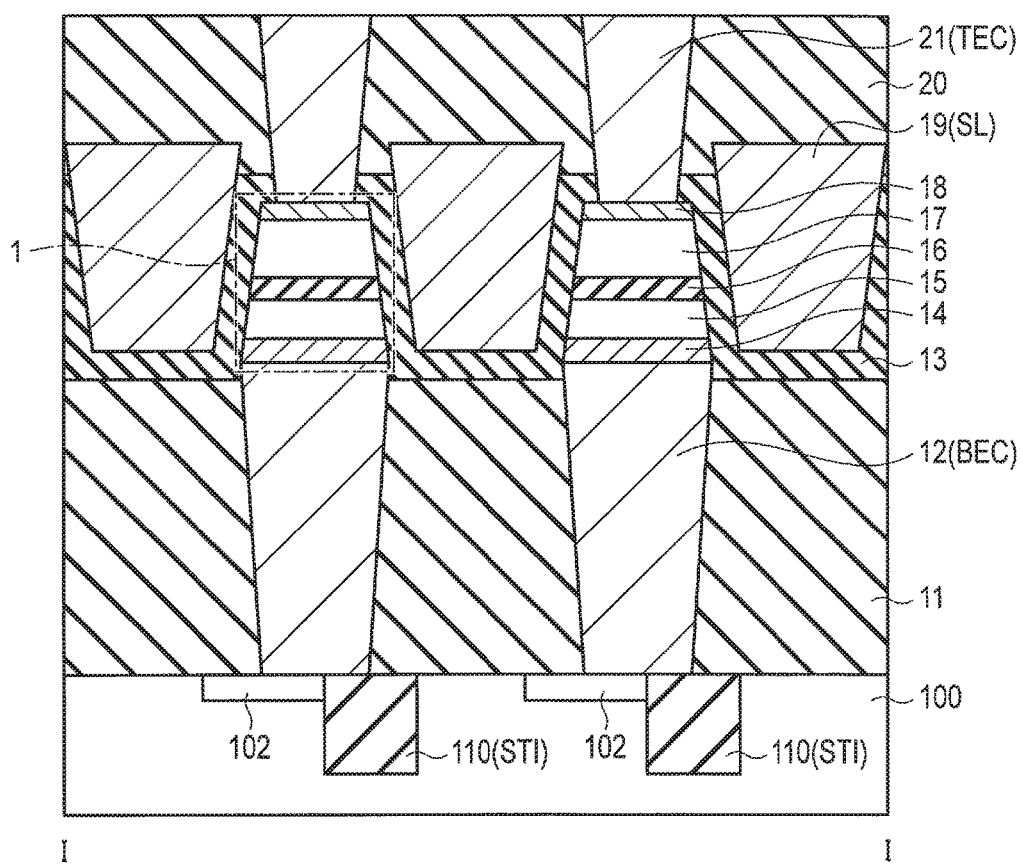
FIG. 18 is a cross-sectional view of the memory cell array taken along line I-I and showing a process of manufacturing the memory cell array in the semiconductor memory device according to the first embodiment.

As shown in FIG. 18, the hole 30 is filled with a conductive material to form the TEC plug 21. For example, the hole 30 is filled with Cu as done in FIGS. 14 and 15.

Figure 19:
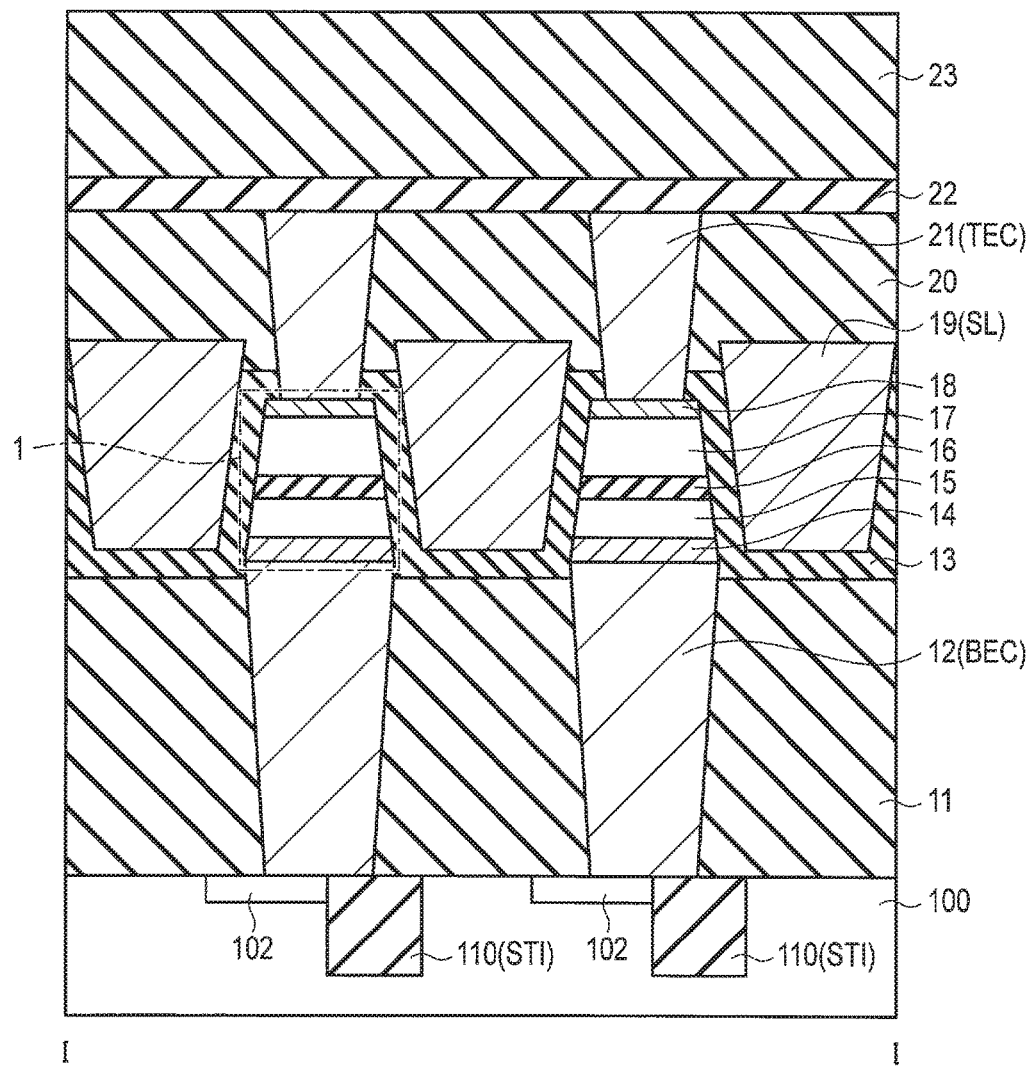
FIG. 19 is a cross-sectional view of the memory cell array taken along line I-I and showing a process of manufacturing the memory cell array in the semiconductor memory device according to the first embodiment.

As shown in FIG. 19, insulation layer 22 and insulation layer 23 are sequentially formed to cover insulation layer 20 and the TEC plug 21. Insulation layer 22 and insulation layer 23 are made of different insulation materials. For insulation layer 22, SiN is used to suppress oxidization of the surface of the TEC plug, for example. For insulation layer 23, $SiO_2$ is used, for example.

As shown in FIG. 20, insulation layers 22 and 23 are partly etched to form the slit 31 which extends in the first direction D1 in such a manner that a part of the bottom surface of the slit 31 reaches the TEC plug 21. After that, the slit 31 is filled with Cu as done in FIGS. 14 and 15, for example. Accordingly, interconnect layer 24 as shown in FIG. 3 is formed.

In the present embodiment, the case where, for example, the TEC plug 21 and interconnect layer 24 are separately formed (the method for separately forming a plug and a interconnect layer is called "single damascene") has been described. However, for example, the TEC plug 21 and interconnect layer 24 may be collectively formed (the method for collectively forming a plug and a interconnect layer is called "dual damascene") in the case of dual damascene, it is possible to, for example, after sequentially forming insulation layers 20, 22, and 23, form the hole 30 and the slit 31, and simultaneously fill the hole 30 and the slit 31 with, for example, Cu.

Moreover, the SLC plug 25 and interconnect layer 19 may be collectively formed by dual damascene. In this case, it is possible to form the hole 28 and the slit 29, and simultaneously fill the hole 28 and slit 29 with, for example, Cu.

1.5 Advantage of Present Embodiment

The configuration according to the present embodiment can improve reliability of the semiconductor memory device. This advantage will be described in detail below.

When data is written in the memory cell MC, a current passes through the memory cell MC. Since the MTJ element 1 is a high-resistance resistor, Joule heat is generated as a current passes therethrough. The Joule heat may cause an effect, such as a decrease in the retention of the MTJ element 1, or a deterioration in the tunnel barrier layer 16. As a result, reliability of the MTJ element 1, such as endurance for data rewriting, or time dependence dielectric breakdown (TDDB), may be deteriorated. If the semiconductor memory device is operated at high speed, a temperature increase of the MTJ element 1 becomes more notable.

In contrast, in the configuration according to the present embodiment, insulation layer 13 having high thermal conductivity is provided on the side surfaces of the MTJ element 1. In addition, source lines SL are provided to interpose the MTJ element 1 therebetween via insulation layer 13. Accordingly, the Joule heat generated in the MTJ element 1 is radiated to the source lines SL via insulation layer 13. Therefore, it becomes possible to suppress the temperature increase of the accessed MTJ element 1 without giving an adverse thermal effect to the other MTJ elements 1 around the accessed MTJ element 1. As a result, deterioration of the MTJ element 1 can be suppressed, and reliability of the semiconductor memory device can be improved.

In addition, covering the side surfaces of the MTJ element 1 with insulation layer 13 suppresses a short circuit between the MTJ element 1 and the source line SL, and improves reliability of the semiconductor memory device.

Moreover, according to the present embodiment, the source line SL is provided between MTJ elements 1 in a different layer from the bit line BL. The distance between the source line SL and the bit line BL is longer when the source line SL and the bit line BL are provided in different layers in comparison to when they are provided in the same layer. Since the short circuit margin between the source line SL and the bit line BL increases, reliability of the source line SL and the bit line BL increases.

In addition, since the distance between the source line SL and the bit line BL increases, the widths of the source line SL and the bit line BL can be increased, and resistances of the source line SL and the bit line BL can be reduced.

Furthermore, providing the source line SL and the bit line BL in different layers allows the height of the source line SL to be different from that of the bit line BL. Since the source line SL may be higher than when the source line SL and the bit line BL are provided in the same layer, the resistance of the source line SL can be reduced.

Moreover, providing the source line SL and the bit line BL in different layers makes the SLC plug 25 connect the source line SL and the semiconductor substrate 100, and the bit line BL provided in different layers. Accordingly, the short circuit margin between the SLC plug 25 and the bit line BL increases. Therefore, reliability of the source line SL and the bit line BL increases.

2. Second Embodiment

Next, the second embodiment will be described. The second embodiment differs from the first embodiment in that a protection layer is provided on the side surfaces of the TEC plug 21. In the following, only the matters different from the first embodiment will be described.

2.1 Cross-Sectional Configuration of Memory Cell Array

Figure 21:
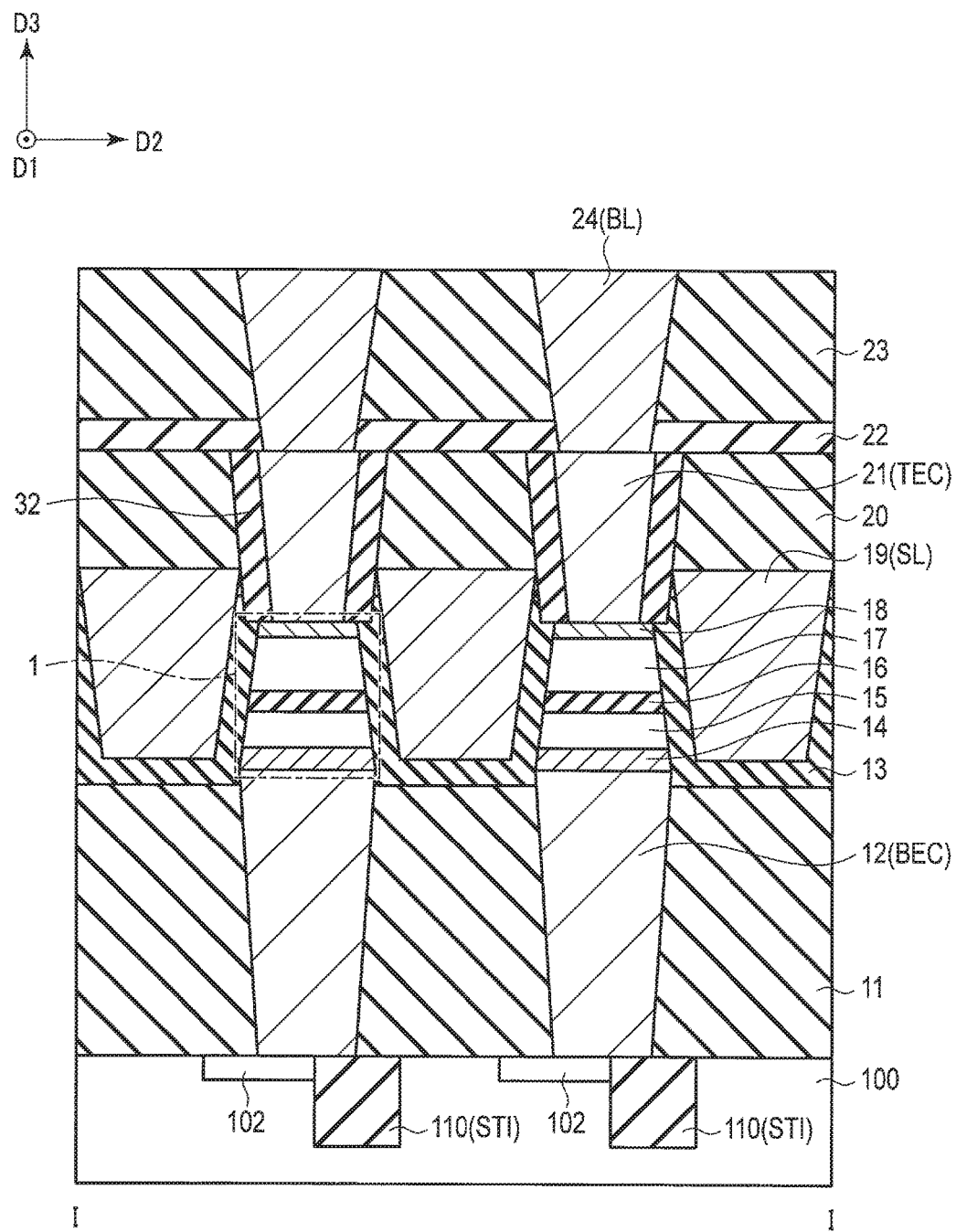
FIG. 21 is a cross-sectional view of the memory cell array in the semiconductor memory device according to the second embodiment, taken along line I-I.

The cross-sectional configuration of the memory cell array MCA will he described. FIG. 21 is a cross-sectional view of the memory cell array MCA in the semiconductor memory device according to the second embodiment, taken along line I-I in FIG. 2. The layout of the memory cell array MCA of the present embodiment is the same as that shown in FIG. 2 of the first embodiment in the following, only the matters different from FIG. 3 of the first embodiment will be described. As shown in FIG. 21, a protection layer 32 is provided on the side surfaces of the TEC plug 21. The protection layer 32 is made of an insulation material, such as SiN. The protection layer 32 is preferably made of an insulation material that has etching selectivity with respect to insulation layer 20 and that can suppress oxidization of the TEC plug 21 or the top electrode 18 of the MTJ element 1.

2.2 Method for Forming Memory Cell Array

Next, a method for forming the memory cell array MCA will be described while focusing on the protection layer 32.

FIGS. 22-25 are cross-sectional views of the memory cell array MCA in the semiconductor memory device according to the second embodiment, taken along line I-I in FIG, 2 and showing a manufacturing process of the memory cell array MCA.

As shown in FIG. 22, the hole 30 having a bottom surface that reaches the top electrode 18 of the MTJ element 1 is formed. The distance between the side surface of the hole 30 and interconnect layer 19 may be shorter than the short circuit margin between interconnect layer 19 and the TEC plug 21. Accordingly, the diameter of the hole 30 may be larger than in the case shown in. FIG. 17 of the first embodiment.

As shown in FIG. 23, the protection layer 32 is formed to cover the top surface of insulation layer 20 and the side and bottom surface of the hole 30. The film thickness of the protection layer 32 is preferably thin to lower the resistance of the TEC plug 21 to be formed later, but is a film thickness which does not cause a short circuit between interconnect layer 19 and the TEC plug 21.

As shown in FIG. 24, the top surface of insulation layer 20 and the protection layer 32 on the bottom surface of the hole 30 are removed by etching to leave the protection layer 32 only on the side wall of the hole 30.

Figure 25:
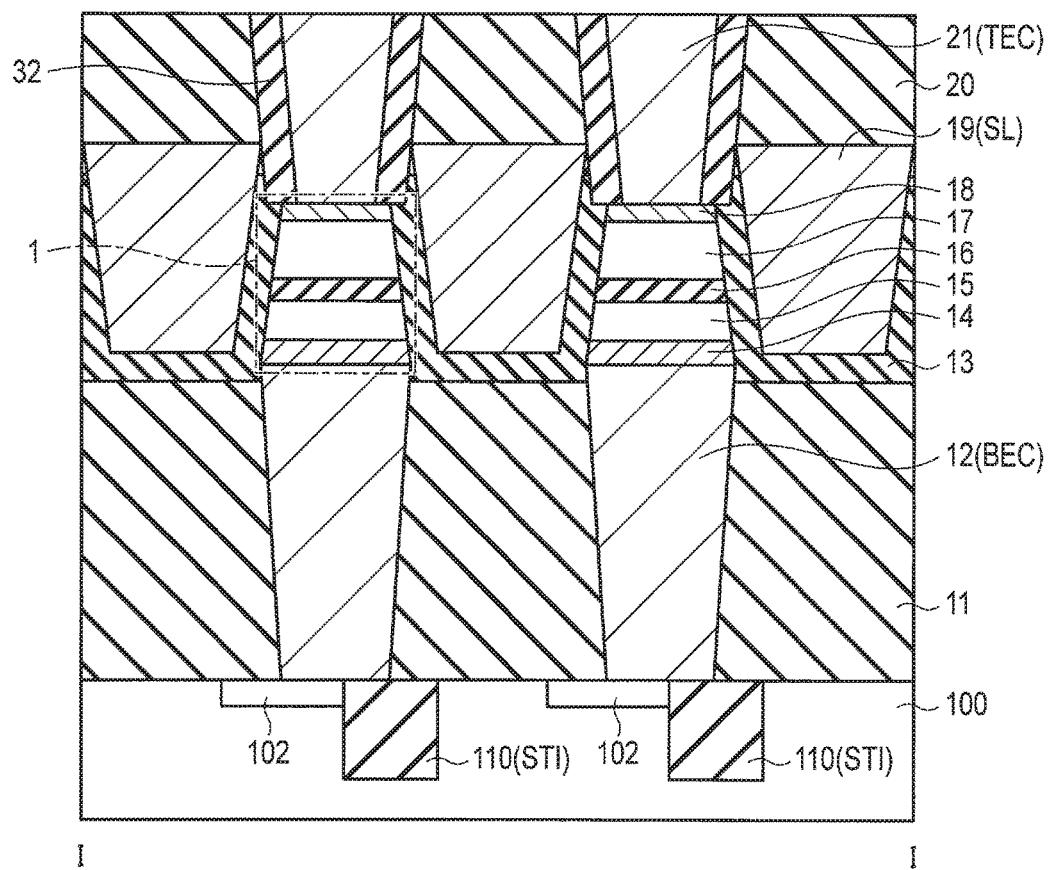
FIG. 25 is a cross-sectional view of the memory cell array taken along line I-I and showing a process of manufacturing the memory cell array in the semiconductor memory device according to the second embodiment.

As shown in FIG. 25, the hole 30 is filled with a conductive material to form the TEC plug 21. For example, the hole 30 is filled with Cu as done in the first embodiment.

After that, the TEC plug 21, insulation layers 22 and 23 and interconnect layer 24 are formed following the same procedure as that of the first embodiment.

2.3 Advantage of Present Embodiment

The configuration of the present embodiment produces advantages similar to those produced by the first embodiment.

In addition, covering the side surfaces of the TEC plug 21 with protection layer 32 suppresses a short circuit between the source line SL and the TEC plug 21, and improves reliability of the semiconductor memory device.

3. Modifications

The semiconductor memory device according to the above-described embodiments includes: first and second variable resistance elements (1 in FIG. 3) provided above a semiconductor layer; a first insulation layer (13 in FIG. 3) provided on top surfaces and side surfaces of the first and the second variable resistance elements; and a first interconnect (19 in FIG. 3) extending in a first direction and provided on the first insulation layer, at least a portion of the first interconnect being opposed to the side surfaces of the first and second variable resistance elements via the first insulation layer.

By applying the above embodiments, a semiconductor memory device that can increase reliability can be provided. The embodiments are not limited to the above-described ones, and various modifications are possible.

3.1 First Modification

For example, the bottom surface of interconnect layer 19 need not be brought into contact with insulation layer 13 in the above-described embodiments. Such an example is shown in FIG. 26.

Figure 26:
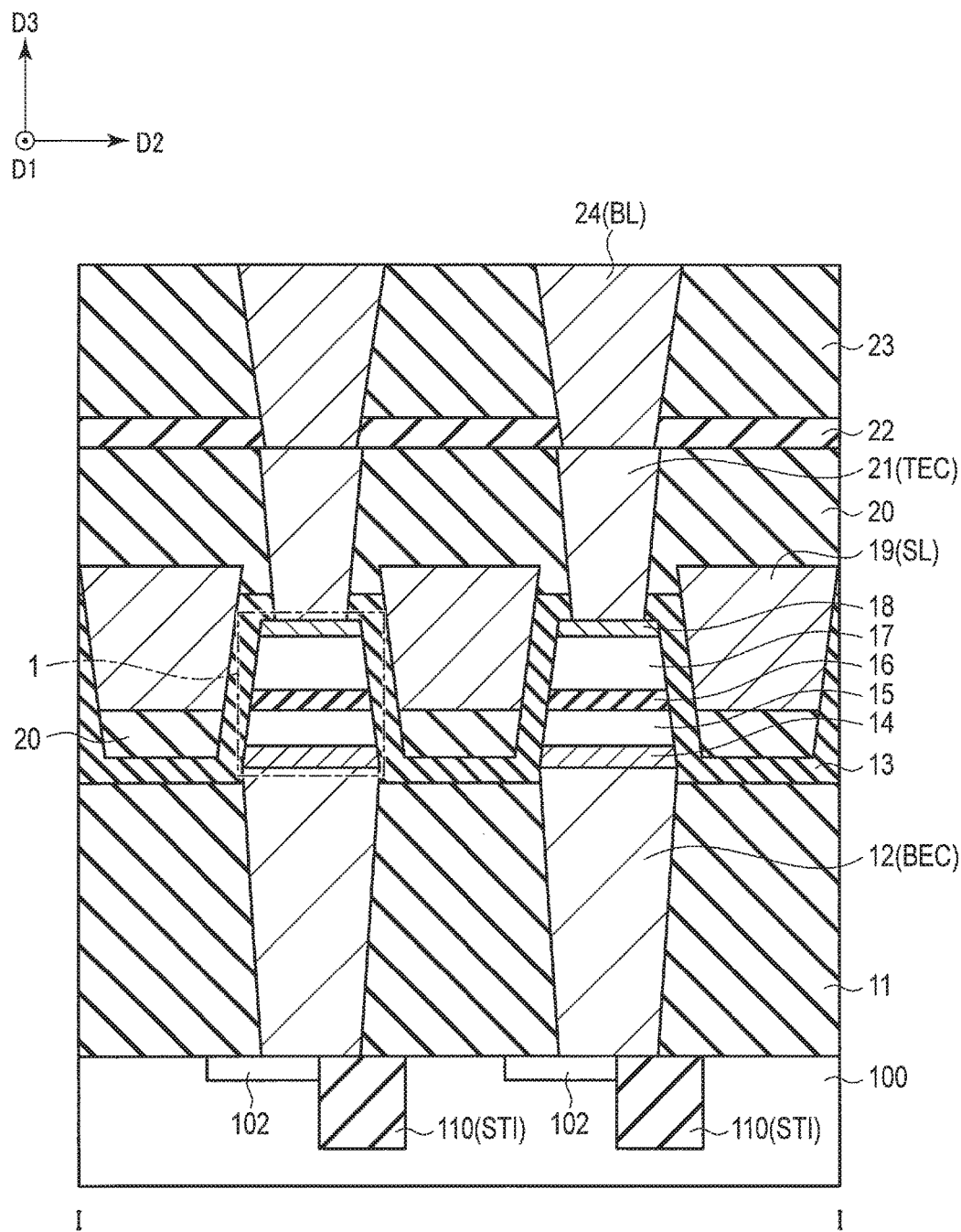
FIG. 26 is a cross-sectional view of the memory cell array in the semiconductor memory device according to the first modification, taken along line I-I.

FIG. 26 is a cross-sectional view of the memory cell array MCA in the semiconductor memory device according to the first modification, taken along line I-I in FIG. 2. The layout of the memory cell array MCA of the present modification is the same as that shown in FIG. 2 of the first embodiment.

As shown in FIG. 26, insulation layer 20 is interposed between the bottom surface of interconnect layer 19 and insulation layer 13. For example, when the silt 29 is etched in FIGS. 12 and 13, insulation layer 20 can be left on insulation layer 13 by setting the etching time shorter than the time by which etching reaches insulation layer 13.

The present modification can produce advantages similar to those of the above-described embodiments.

3.2 Second Modification

For example, the level of the bottom surface of interconnect layer 19 may be lower than that of the top surface of the SEC plug 12. Such an example is shown in FIG. 27.

FIG. 27 is a cross-sectional view of the memory cell array MCA in the semiconductor memory device accord the second modification, taken along line I-I in FIG. 2. The layout of the memory cell array MCA of the present modification is the same as that shown in FIG. 2 of the first embodiment.

As shown in FIG. 27, the level of the bottom surface of interconnect layer 19 is lower than the top surface of the BEC plug 12. For example, when the MTJ element 1 is etched in FIG. 6, the etching amount of insulation layer 11 increases by increasing the over-etching time. The level of the bottom surface of insulation layer 13 can be thereby lowered. When insulation layer 13 is formed in FIG. 7, the film thickness of insulation layer 13 is controlled so that the level of the top surface of insulation layer 13 is lower than the top surface of the BEC plug 12. Accordingly, the level of the bottom surface of interconnect layer 19 becomes lower than the top surface of the BEC plug 12.

The present modification can also produce advantages similar to those of the above-described embodiments.

3.3 Third Modification

For example, the level of the top surface of interconnect layer 19 may be lower than that of the top surface of the top electrode 18 of the MTJ element 1. Such an example is shown in FIG. 28.

FIG. 28 is a cross-sectional view of the memory cell array MCA in the semiconductor memory device according to the third modification, taken along line I-I in FIG. 2. The layout of the memory cell array MCA of the present modification is the same as that shown in FIG. 2 of the first embodiment.

As shown in FIG. 28, the level of the top surface of interconnect layer 19 is lower than that of the top surface of the top electrode 18 of the MTJ element 1. For example, when insulation layer 20 is subjected to CMP in FIG. 9, the polishing time is increased so that insulation layer 20 does not remain on insulation layer 13 on the MTJ element 1. In addition, when Cu/Ta/TaN on insulation layer 13 is removed by CMP, the over-polishing time of CMP is increased. Accordingly, the level of the top surface of interconnect layer 19 becomes lower than that of the top surface of the top electrode 18 of the MTJ element 1.

The present modification can also produce advantages similar to those of the above-described embodiments. Moreover, the present modification can further improve the short circuit margin between interconnect layer 19 and the TEC plug 21.

3.4 Fourth Modification

For example, the above-described embodiments may adopt a buried gate structure in which the gate insulation film 26 and gate electrode 27 of the selection transistor 2 are buried in the semiconductor substrate 100. Such an example is shown in FIG. 29.

Figure 29:
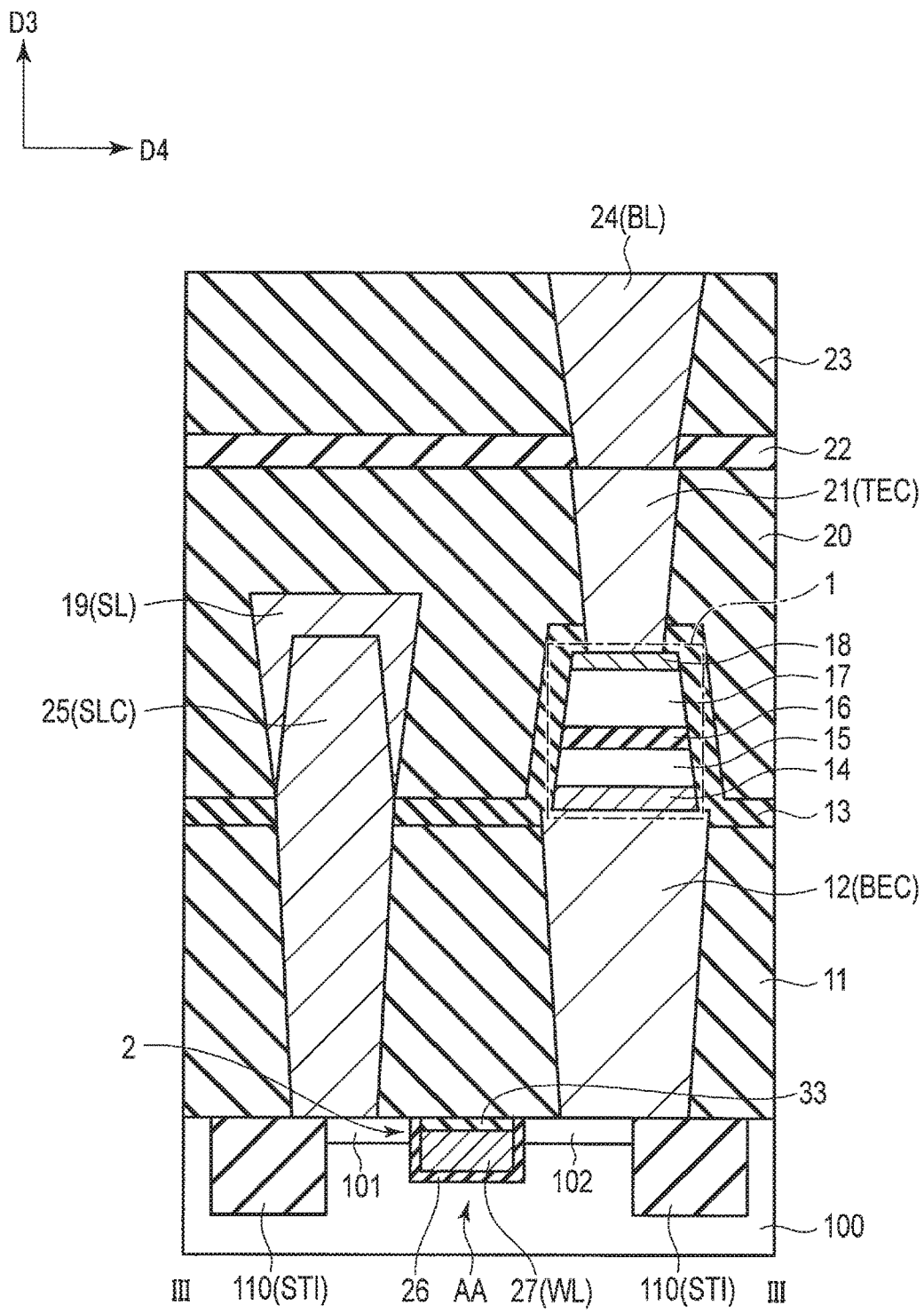
FIG. 29 is a cross-sectional view of the memory cell array in the semiconductor memory device according to the fourth modification, taken along line III-III.

FIG. 29 is a cross-sectional view of the memory cell array MCA in the semiconductor memory device according to the fourth modification, taken along line I-I in. FIG. 2. The layout of the memory cell array MCA of the present modification is the same as that shown in FIG. 2 of the first embodiment.

As shown in FIG. 29, the gate electrode 27 is buried in the semiconductor substrate 100. The level of the top surface of the gate electrode 27 is lower than the level of the top surface of the semiconductor substrate 100. Insulation layer 33 is provided on the gate electrode 27. For example, SiN is used for insulation layer 33. The gate insulation film 26 is provided on the bottom and side surfaces of the gate electrode 27. The side surfaces of the gate electrode 27 are brought into contact with the source/drain diffusion layers 101 and 102 via the gate insulation film 26.

The present modification can also produce advantages similar to those of the above-described embodiments.

3.5 Other Modifications

Descriptions of the above embodiments are provided while taking the MRAM as an example of the semiconductor memory device; however, the embodiments are not limited to this, and may be applied to a semiconductor memory device using a variable resistance element that generates heat when operating, or a resistance change type memory other than the MRAM, such as a resistive random access memory (ReRAM) or a phase-change random access memory (PCRAM).

In addition, the terms "connect" and "couple" in the above embodiments include the state where indirect connection or coupling via a transistor, a resistance or the like.

While certain embodiments have been described, these embodiments have been presented by way of example only, and are not intended to limit the scope of the inventions. Indeed, the novel methods and systems described herein may be embodied in a variety of other forms; furthermore, various omissions, substitutions, and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   first and second variable resistance elements provided above a semiconductor layer;
   a first insulation layer provided on top surfaces and side surfaces of the first and the second variable resistance elements;
   a first interconnect extending in a first direction and provided on the first insulation layer, at least a portion of the first interconnect being opposed to the side surfaces of the first and second variable resistance elements via the first insulation layer;
   a first transistor including first and second diffusion layers provided in the semiconductor layer, a gate insulation film, and a gate electrode;
   a first plug coupling the first diffusion layer and the first variable resistance element; and
   a second plug coupling the second diffusion layer and the first interconnect,
   wherein a portion of a side surface of the second plug is in contact with the first interconnect.

2. The device according to claim 1, wherein:
   each of the first and second variable resistance elements is a magnetic tunnel junction (MTJ) element, the MTJ element includes a magnesium oxide (MgO) layer, and a level of a bottom surface of the MgO layer is between levels of a bottom surface and a top surface of the first interconnect.

3. A semiconductor memory device comprising:

first and second variable resistance elements provided above a semiconductor layer;

a first insulation layer provided on top surfaces and side surfaces of the first and the second variable resistance elements;

a first interconnect extending in a first direction and provided on the first insulation layer, at least a portion of the first interconnect being opposed to the side surfaces of the first and second variable resistance elements via the first insulation layer;

a first transistor including first and second diffusion layers provided in the semiconductor layer, a gate insulation film, and a gate electrode;

a first plug coupling the first diffusion layer and the first variable resistance element;

a second plug coupling the second diffusion layer and the first interconnect;

third and fourth plugs coupled to the first and second variable resistance elements, respectively; and second and third interconnects extending in the first direction and provided on the third and fourth plugs, respectively, wherein a level of a bottom surface of the first interconnect differs from levels of bottom surfaces of the second and third interconnects.

4. The device according to claim 3, wherein:

each of the first and second variable resistance elements is a magnetic tunnel junction (MTJ) element, the MTJ element includes a magnesium oxide (MgO) layer, and a level of a bottom surface of the MgO layer is between levels of the bottom surface and a top surface of the first interconnect.

* * * * *